United States Patent
Nakagawa et al.

(10) Patent No.: US 9,023,717 B2
(45) Date of Patent: May 5, 2015

(54) METHOD FOR MANUFACTURING SEMICONDUCTOR DEVICE

(71) Applicant: Renesas Electronics Corporation, Kanagawa (JP)

(72) Inventors: Kazuyuki Nakagawa, Kanagawa (JP); Shunichi Abe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/485,649

(22) Filed: Sep. 12, 2014

(65) Prior Publication Data

US 2015/0079762 A1 Mar. 19, 2015

(51) Int. Cl.
*H01L 21/78* (2006.01)
*H01L 21/66* (2006.01)

(52) U.S. Cl.
CPC ....... *H01L 21/78* (2013.01); *H01L 2223/54473* (2013.01); *H01L 2223/5448* (2013.01); *H01L 22/32* (2013.01); *H01L 2223/5446* (2013.01); *H01L 2223/54453* (2013.01)

(58) Field of Classification Search
CPC . H01L 21/78; H01L 22/32; H01L 2223/5446; H01L 2223/5448; H01L 2223/54453; H01L 2223/54473
USPC .......... 438/463, 462, 460, 113; 257/E21.599
See application file for complete search history.

(56) References Cited

U.S. PATENT DOCUMENTS

| 7,091,624 B2 * | 8/2006 | Iijima et al. ............... 257/797 |
| 7,892,949 B2 | 2/2011 | Abe et al. |
| 8,198,919 B1 * | 6/2012 | Kozhanov et al. ........... 326/104 |
| 8,298,963 B2 * | 10/2012 | Akiba et al. ................. 438/773 |
| 2007/0173035 A1 * | 7/2007 | Izumi ........................... 438/464 |
| 2009/0121337 A1 * | 5/2009 | Abe et al. .................... 257/686 |
| 2010/0096732 A1 * | 4/2010 | Koubuchi et al. ........... 257/620 |
| 2013/0299947 A1 * | 11/2013 | Uehling ...................... 257/620 |

FOREIGN PATENT DOCUMENTS

| JP | 2005-340423 A | 12/2005 |
| WO | 2007/055270 A1 | 5/2007 |

* cited by examiner

*Primary Examiner* — Michael Trinh
(74) *Attorney, Agent, or Firm* — McDermott Will & Emery LLP

(57) ABSTRACT

To provide a semiconductor device having improved reliability. A method of manufacturing a semiconductor device according to one embodiment includes a step of cutting, in a dicing region arranged between two chip regions adjacent to each other, a wafer along an extending direction of the dicing region. The dicing region has therein a plurality of metal patterns in a plurality of columns. In the step of cutting the wafer, one or more of the columns of metal patterns formed in a plurality of columns are removed, and the metal patterns of the column(s) different from the above-mentioned one or more of the columns are not removed.

14 Claims, 25 Drawing Sheets

METHOD FOR MANUFACTURING SEMICONDUCTOR DEVICE

CROSS-REFERENCE TO RELATED APPLICATIONS

The disclosure of Japanese Patent Application No. 2013-190738 filed on Sep. 13, 2013 including the specification, drawings and abstract is incorporated herein by reference in its entirety.

BACKGROUND

The present invention relates to a technology of manufacturing a semiconductor device, in particular, to a technology effective when applied to a method of manufacturing a semiconductor device including a step of cutting a semiconductor wafer having a metal pattern formed in a cutting region thereof.

Japanese Patent Laid-Open No. 2005-340423 (Patent Document 1) describes a method of cutting, in a step of cutting a semiconductor wafer having a test pad formed in a cutting region thereof, the semiconductor wafer with a modified layer formed by exposing the semiconductor wafer to laser radiation as a starting point.

International Patent Publication No. 2007/055270 (Patent Document 2) describes a method of forming, in a step of cutting a semiconductor wafer having a test pad in a cutting region thereof, a modified layer as a starting point of cutting by exposing a position of the semiconductor wafer having no test pad thereon to laser radiation.

PATENT DOCUMENTS

[Patent Document 1] Japanese Patent Laid-Open No. 2005-340423

[Patent Document 2] International Patent Publication No. 2007/055270

SUMMARY

There is a technology of forming metal patterns such as test pads in a dicing region which is a region to be cut when a semiconductor wafer is divided into a plurality of semiconductor chips. In the step of cutting and dividing a semiconductor wafer into a plurality of semiconductor chips, it is preferred to cut the wafer without leaving debris of the metal patterns on the semiconductor chip.

As semiconductor devices become more sophisticated, the number of test pads formed on one semiconductor wafer tends to increase. When the planar size of a semiconductor chip increases, an area of a dicing region in which test pads are arranged decreases. As a result, an arrangement space of metal patterns formed in a dicing region is sometimes secured by forming metal patterns in a plurality of columns between two chip regions adjacent to each other. In this case, the metal patterns are arranged at a high density so that it becomes difficult to cut the semiconductor wafer without leaving debris of the metal patterns.

Other problems and novel features will become apparent from the description herein and accompanying drawings.

A method of manufacturing a semiconductor device according to one embodiment includes a step of cutting, in a dicing region arranged between two chip regions adjacent to each other, a semiconductor wafer along an extending direction of the dicing region. The dicing region has therein a plurality of metal patterns in a plurality of columns. In the step of cutting the semiconductor wafer, the semiconductor wafer is cut so as to remove some of the columns of the metal patterns formed in a plurality of columns while preventing the removal of patterns belonging to columns different from the above-mentioned some columns.

According to the above-mentioned embodiment, a semiconductor device having improved reliability can be provided.

DETAILED DESCRIPTION

Figure 1:
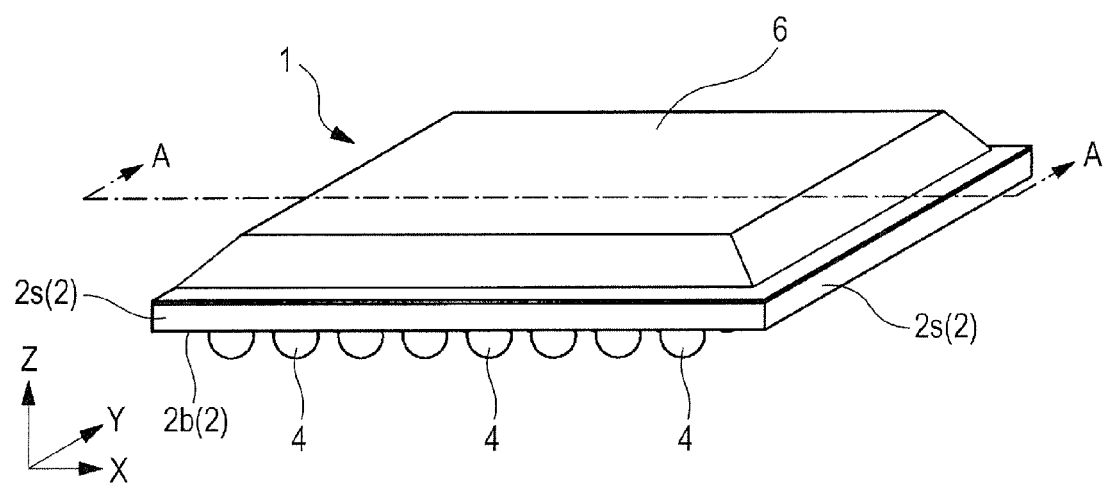
FIG. 1 is a perspective view of a semiconductor device according to an embodiment.

Explanation of Description Manner, Basic Terms, and Usage in the Present Application In the present application, a description in each mode may be made after divided in a plurality of sections if necessary for the sake of convenience. These sections are not independent from each other unless otherwise particularly specified, but they may each be a part of a single example or one of them may be a partial detail of the other or a modification example of a part or whole of the other one irrespective of their order of appearance. In principle, a description of a portion similar to that described before is omitted. Moreover, constituent components in each mode are not essential unless otherwise particularly specified, limited to the number theoretically, or apparent from the context.

Similarly, in the description of each mode or the like, the term "X made of A" or the like with regard to a material, component, or the like does not exclude a member containing a component other than A unless otherwise particularly specified or unless otherwise evident from the context. For example, with regard to a component, the above term means "X containing A as a principal component" or the like. It is needless to say that for example, the term "silicon member" or the like is not limited to a pure silicon member but it may include a member containing a multicomponent alloy having silicon as a main component such as SiGe alloy, an additive, and the like. In addition, the term "gold plating", "Cu layer", "nickel plating", or the like includes not only a pure member but also a member containing gold, Cu, nickel, or the like as a main component, respectively, unless otherwise particularly specified.

When a reference is made to a specific numerical value or amount, it may be more than or less than the specific numerical value or amount unless otherwise particularly specified, limited to the specific numerical value or amount theoretically, or apparent from the context.

In all the drawings in the embodiment, the same or like members will be identified by the same or like symbols or reference numerals and overlapping descriptions will be omitted in principle.

In the application, the term "upper surface" or "lower surface" is sometimes used. Semiconductor packages are mounted according to various modes. In some modes, after a semiconductor package is mounted, the upper surface may be arranged below the lower surface. In the application, a flat surface of a semiconductor chip on the element formation surface side is called "surface" and a surface of the semiconductor chip opposite thereto is called "back surface. Further, a flat surface of a wiring substrate on the chip mounting surface side is called "upper surface" or "surface" and a surface of the wiring substrate opposite thereto is called "lower surface".

In the accompanying drawings, hatching or the like is sometimes omitted even from the cross-section when it makes the drawing complicated or when a member can be distinguished clearly from a vacant space. In relation thereto, even a two-dimensionally closed hole may be shown without a background contour thereof when it is obvious from the description or the like that the hole is two-dimensionally closed. On the other hand, in order to clearly show that a region is not a vacant space or to clearly show a boundary of regions, hatching or a dot pattern may be added even when the drawing is not a cross-sectional view.

Embodiment

Semiconductor Device

Figure 2:
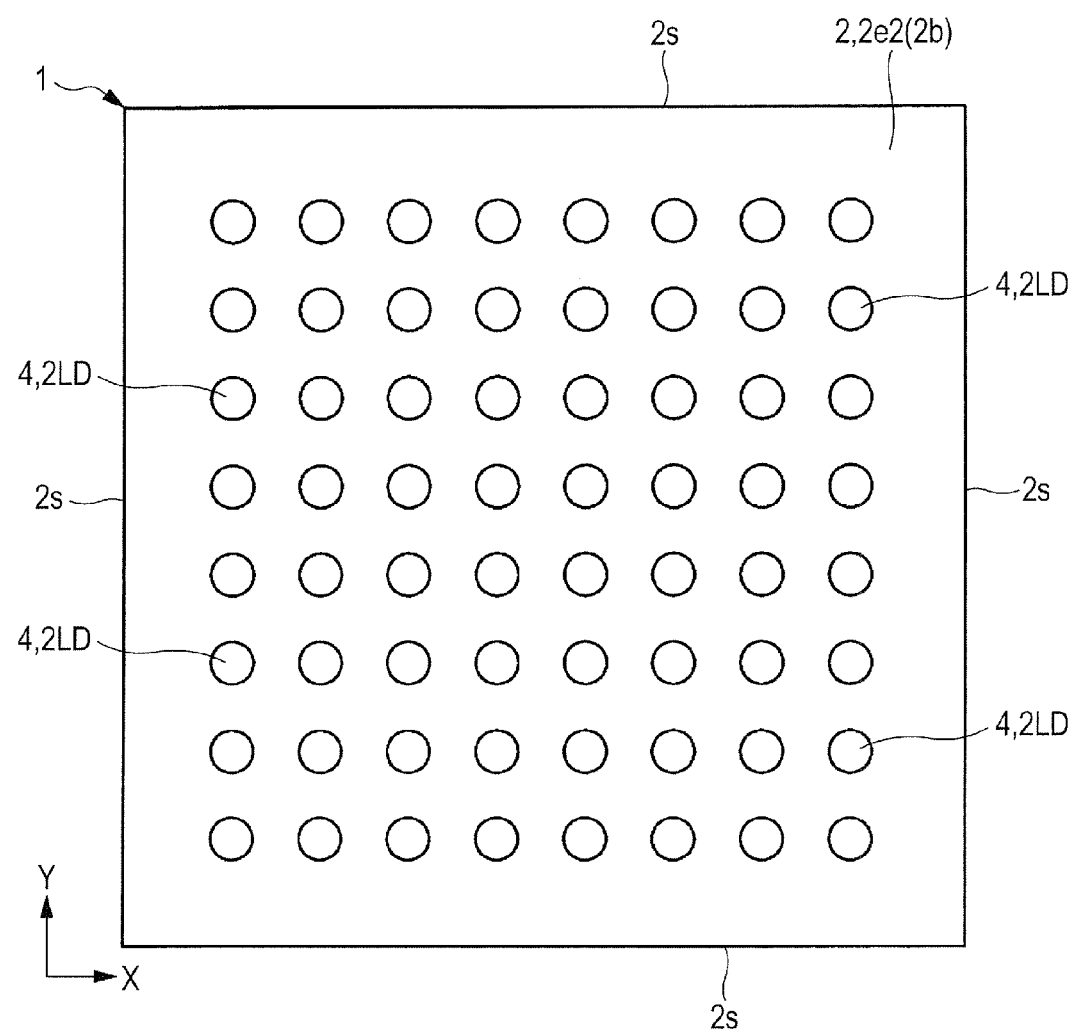
FIG. 2 is a bottom view of the semiconductor device shown in FIG. 1.
Figure 3:
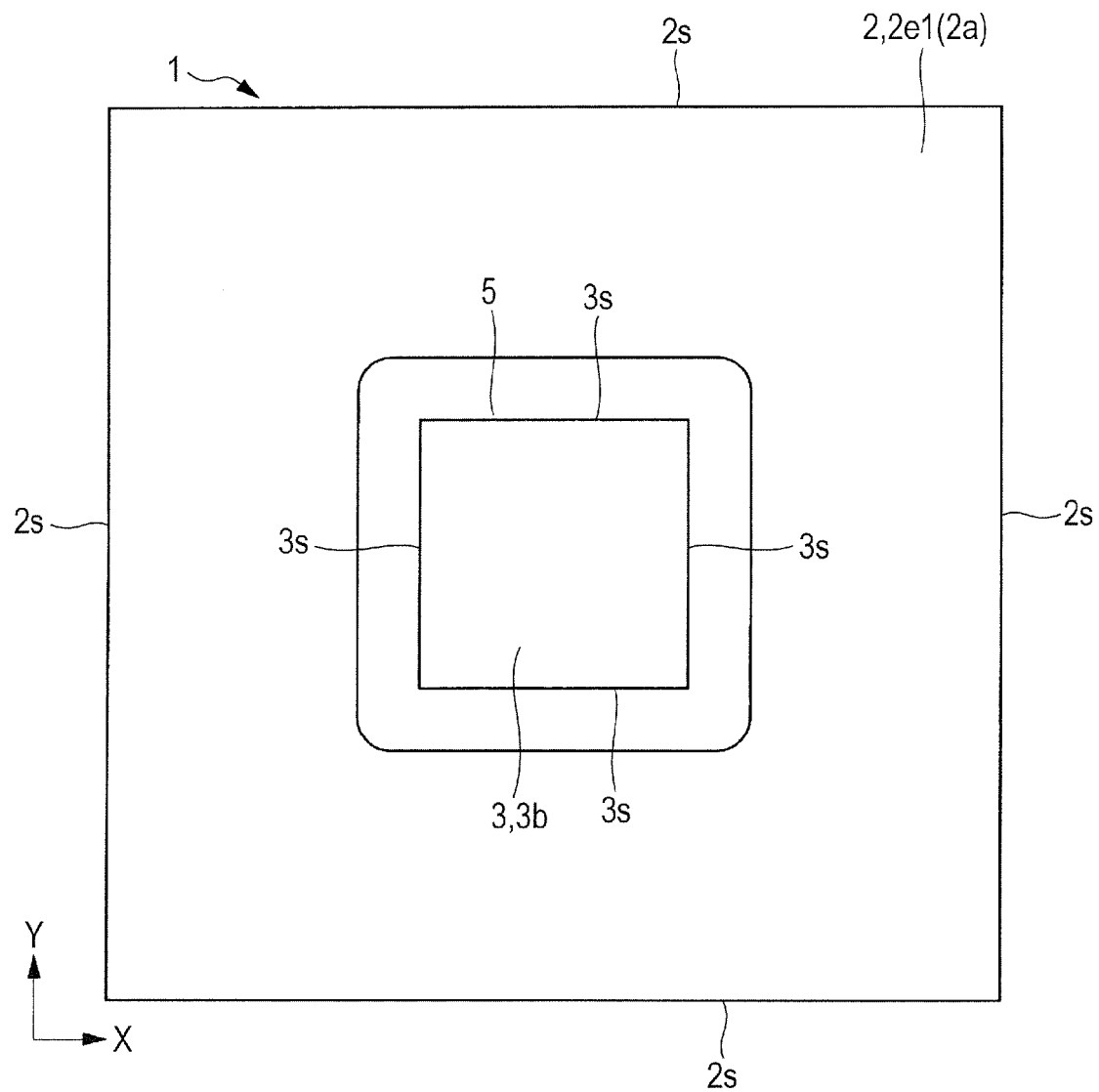
FIG. 3 is a perspective plan view showing the internal structure of the semiconductor device on a wiring substrate while removing the heatsink shown in FIG. 1 from the device.
Figure 4:
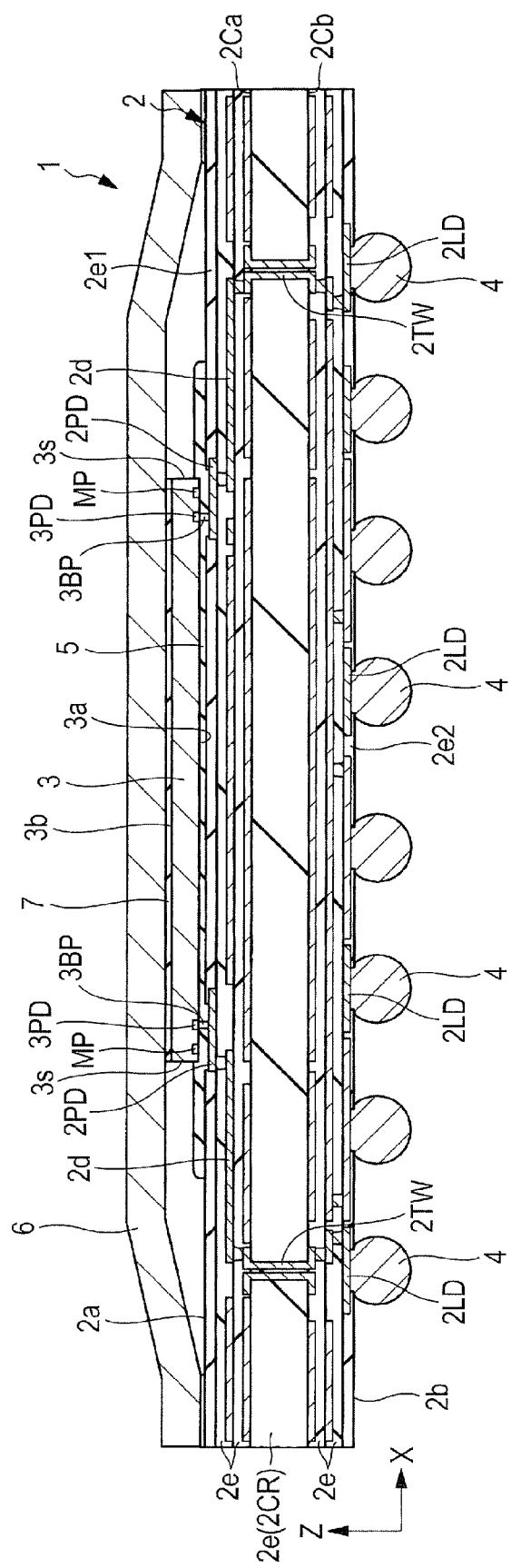
FIG. 4 is a cross-sectional view taken along the line A-A of FIG. 1.

The rough configuration of a semiconductor device 1 according to the present embodiment will be described referring to FIGS. 1 to 4. The semiconductor device 1 according to the present embodiment has a wiring substrate 2 and a semiconductor chip 3 (refer to FIGS. 3 and 4) mounted over the wiring substrate 2. FIG. 1 is a perspective view of the semiconductor device according to the present embodiment. FIG. 2 is a bottom view of the semiconductor device shown in FIG. 1. FIG. 3 is a perspective plan view showing the internal structure of the semiconductor device on a wiring substrate while removing the heatsink shown in FIG. 1 from the device. FIG. 4 is a cross-sectional view taken along the line A-A in FIG. 1. In FIGS. 1 to 4, the number of terminals is reduced to facilitate viewing. In FIG. 4, the number of solder balls 4 is made smaller than that in the example shown in FIG. 2 in order to facilitate viewing. The number of terminals (bonding pads 2PD, lands 2LD, or solder balls 4) is not limited to the mode shown in FIGS. 1 to 4. This embodiment can be applied to a semiconductor device having from about 100 to 10,000 terminals such as bonding pads 2PD, lands 2LD, and solder balls 4.

As illustrated in FIG. 4, the wiring substrate 2 has an upper surface (surface, main surface, first surface, or chip mounting surface) 2a on which the semiconductor device is mounted; a lower surface (surface, main surface, second surface, or mounting surface) 2b opposite to the upper surface 2a, and side surface 2s (refer to FIGS. 1 to 3) arranged between the upper surface 2a and the lower surface 2b. The wiring substrate has a quadrangular outer shape in plan view as shown in FIGS. 2 and 3. In the example shown in FIGS. 2 and 3, the wiring substrate 2 is square-shaped and its planar size (size in plan view, size of the upper surface 2a and the lower surface 2b, outer size) is, for example, from about 12 mm to 60 mm on a side. The thickness (height) of the wiring substrate 2, that is, a distance from the upper surface 2a to the lower surface 2b shown in FIG. 4 is, for example, from about 0.3 mm to 1.3 mm.

The wiring substrate 2 is an interposer for electrically connecting the semiconductor chip 3 mounted on the side of the upper surface 2a with an unillustrated mounting substrate and it has a plurality of wiring layers (six layers in the example shown in FIG. 4) electrically connecting the side of the upper surface 2a which is a chip mounting surface and the side of the lower surface 2b to be mounted on the mounting substrate. The wiring substrate 2 is formed, for example, by stacking, using a build-up method, the plurality of wiring layers on each of an upper surface 2Ca and a lower surface 2Cb of an insulating layer (core material or core insulating layer) made of a prepreg obtained by impregnating glass fibers or carbon fibers with a resin. The wiring layers on the side of the upper surface 2Ca of the insulating layer 2CR and the wiring layer on the side of the lower surface 2Cb are electrically connected with each other via a plurality of through-hole wirings 2TW buried in a plurality of through-holes provided so as to penetrate from one of the upper surface 2Ca and the lower surface 2Cb to the other.

The wiring substrate 2 has, on the upper surface 2a thereof, a plurality of bonding pads (bonding leads or semiconductor chip connecting terminals) 2PD to be electrically connected with the semiconductor chip 3. The upper surface 2a of the wiring substrate 2 is covered with a solder resist film (insulating film) 2e1 and a plurality of bonding pads 2PD is exposed from opening portions formed in the solder resist film 2e1, respectively. The wiring substrate 2 has, on the lower surface 2b thereof, a plurality of lands 2LD serving as an external input/output terminals of the semiconductor device 1. The lower surface 2b of the wiring substrate 2 is covered with a solder resist film (insulating film) 2e2 and a plurality of lands 2LD is exposed from opening portions formed in the solder resist film 2e2, respectively. The plurality of bonding pads 2PD and the plurality of lands 2LD are electrically connected with each other via a plurality of wirings 2d or through-hole wirings 2TW formed on the wiring substrate 2.

In the example shown in FIG. 4, solder balls (solder materials, external terminals, electrodes, or external electrodes) 4 are connected with the lands 2LD, respectively. The solder balls 4 are conductive members which electrically connect a plurality of terminals (not illustrated) on the side of an unillustrated mounting substrate with the plurality of lands 2LD when the semiconductor device 1 is mounted on the mounting substrate. The solder balls 4 are, for example, Sn—Pb solder materials containing lead (Pb) or solder materials substantially containing no Pb, in other words, solder materials composed of lead-free solder. Examples of the lead-free solder include a solder composed only of tin (Sn), a tin-bismuth (Sn—Bi) solder, a tin-copper-silver (Sn—Cu—Ag) solder, and a tin-copper (Sn—Cu) solder. The term "lead-free solder" means a solder having a lead (Pb) content of 0.1 wt % or less and this content is determined to comply with the requirements of RoHS (Restriction of Hazardous Substances) directive.

As shown in FIG. 2, a plurality of solder balls 4 is arranged in rows and columns (in array or in matrix). Although not illustrated in FIG. 2, the plurality of lands 2LD (refer to FIG. 4) to which the plurality of solder balls 4 are bonded is also arranged in rows and columns (in matrix). Such a semiconductor device having, on the mounting surface side of the wiring substrate 2, a plurality of external terminals (solder balls 4 or lands 2LD) arranged in rows and columns is called "area array type semiconductor device". The area array type semiconductor device is preferred because the wiring substrate 2 on the side of the mounting surface (lower surface 2b) can be effectively used as an arrangement space of external terminals and an increase in mounting area of the semiconductor device can therefore be suppressed in spite of an increase in the number of external terminals. This means that even if the number of external terminals increases with an increasing demand for highly functional and highly integrated semiconductor devices, mounting of them can be achieved with a less space.

The semiconductor device 1 has semiconductor chips 3 to be mounted on the wiring substrate 2. As shown in FIG. 4, each of the semiconductor chips 3 has a surface (main surface, upper surface) 3a, a back surface (main surface, lower surface) 3b opposite to the surface 3a, and side surfaces 3s positioned between the surface 3a and the back surface 3b. As shown in FIG. 3, in plan view, each of them has a quadrangular outer shape with a planar area smaller than that of the wiring substrate 2. In the example shown in FIG. 3, the semiconductor chips 3 are each mounted at a center portion of the upper surface 2a of the wiring substrate 2 so that four side surfaces 3s each extend along the four side surfaces 2s of the wiring substrate 2, respectively.

As shown in FIG. 4, the semiconductor chips 3 each have, on the surface 3a thereof, a plurality of pads (bonding pads) 3PD. In the present embodiment, the pads 3PD are formed along each of the sides (along the side surfaces 3s) of the surface 3a. In the example shown in FIG. 4, the semiconductor chip 3 is mounted on the wiring substrate 2 with the surface 3a being arranged so as to face to the upper surface 2a of the wiring substrate 2. Such a mounting method is called "face-down mounting method" or "flip-chip connection method".

The semiconductor chip 3 (more specifically, base material of the semiconductor chip 3) is composed of, for example, silicon (Si). It has, on the surface 3a thereof, an insulating film that covers therewith the base material of the semiconductor chip 3 and a wiring. The respective surfaces of the pads 3PD are exposed from the opening portions formed in this insulating film. These pads 3PD are each made of a metal and in the present embodiment, the metal is, for example, aluminum (Al).

As shown in FIG. 4, a plurality of protruding electrodes 3BP is connected with the plurality of pads 3PD, respectively. The plurality of pads 3PD of the semiconductor chip 3 and the plurality of bonding pads 2PD of the wiring substrate 2 are electrically connected with each other via the plurality of protruding electrodes 3BP, respectively. The protruding electrodes 3BP are each a metal member formed so as to protrude above the surface 3a of the semiconductor chip 3. Examples of it include a solder bump made of a solder material and a pillar bump obtained by forming a solder film at the tip surface of a conductor pillar made of copper (Cu) or nickel (Ni). The details of the semiconductor chips 3 will be described later in detail.

As shown in FIG. 4, the semiconductor chip 3 and the wiring substrate 2 have therebetween an underfill resin (insulating resin) 5. The underfill resin 5 is arranged so as to block a space between the surface 3a of the semiconductor chip 3 and the upper surface 2a of the wiring substrate 2. Further, the underfill resin 5 is made of an insulating (non-conductive) material (for example, resin material) and is arranged so as to seal an electrically connected portion (joint of the plurality of protruding electrodes 3BP) between the semiconductor chip 3 and the wiring substrate 2. In such a manner, the underfill resin 5 is arranged so as to seal the connected portion of the plurality of protruding electrodes 3BP and it can relax a stress generated at the electrically connected portion between the semiconductor chip 3 and the wiring substrate 2.

In the example shown in FIG. 4, the semiconductor chip 3 has a heatsink (heat spreader) 6 attached onto the back surface 3b thereof. The heatsink 6 is a metal plate having a thermal conductivity higher than that of the wiring substrate 2 and is equipped with a function of discharging outside the heat generated from the semiconductor chip 3. In addition, the heatsink 6 is attached to the back surface 3b of the semiconductor chip 3 via an adhesive material (heat radiating resin) 7. The adhesive material 7 has a thermal conductivity higher than that of the underfill resin 5 because it contains a large number of metal particles and the like.

In the example shown in FIG. 4, the heatsink 6 is attached and fixed, at the peripheral portion thereof, to the wiring substrate 2. Even the heatsink 6 having a planar area greater than that of the back surface 3b of the semiconductor chip 3 can be fixed stably to the wiring substrate 2 by attaching and fixing the peripheral portion of the heatsink 6 thereto. This results in an increase in the surface area of the heatsink 6 and improvement in radiation efficiency. In addition, the warpage of the wiring substrate 2 can be suppressed, leading to improvement in the mounting reliability of the semiconductor device 1.

The semiconductor device shown in FIGS. 1 to 4 is one example of the mounting mode of the semiconductor chip 3 and there are various modification examples of it. In one modification example, the heatsink 6 shown in FIG. 4 is not attached to the semiconductor chip 3. In another example, the semiconductor chip 3 can be mounted on the wiring substrate 2 by using a so-called face-up mounting method, that is, a method of facing the upper surface 2a, which is a chip mounting surface, of the wiring substrate 2 and the back surface 3b of the semiconductor chip 3 to each other. When the face-up mounting method is employed, the wiring substrate 2 and the semiconductor chip 3 may be electrically connected with each other via a plurality of unillustrated metal wires. From the standing point of protecting the circuit formation surface of the semiconductor chip 3 and the connected portion via the metal wires, the semiconductor chip 3 and the plurality of metal wires may be covered and sealed with a resin. In another modification example, the semiconductor chip 3 is mounted on an unillustrated leadframe.

<Semiconductor Chip>

Figure 5:
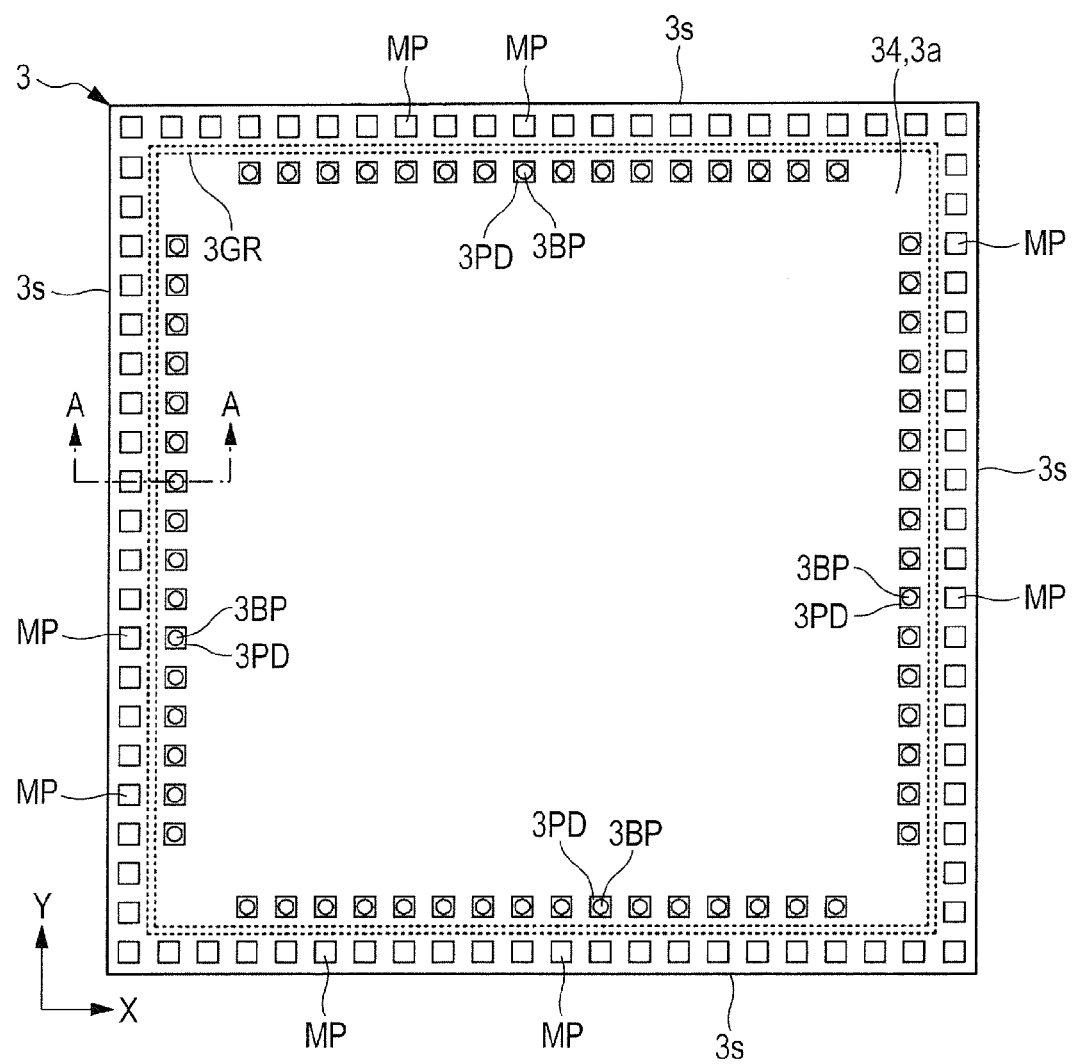
FIG. 5 is a plan view showing the surface side of the semiconductor chip shown in FIG. 3.
Figure 6:
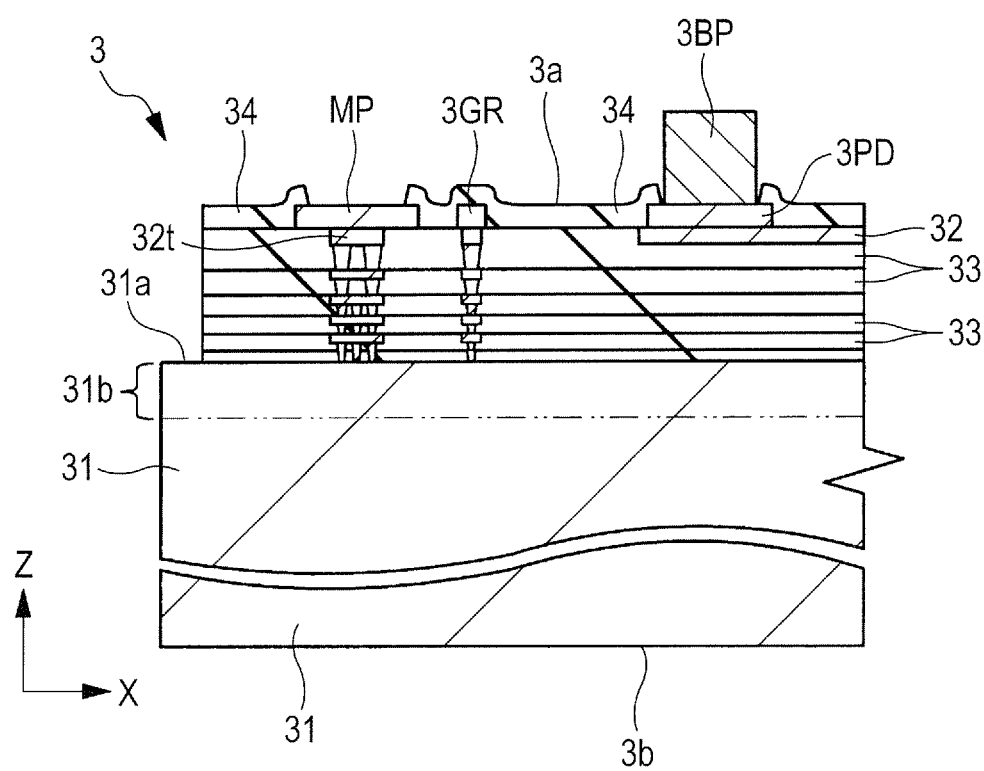
FIG. 6 is an enlarged cross-sectional view taken along the line A-A of FIG. 5.

Next, the semiconductor ship shown in FIGS. 3 and 4 will be described. FIG. 5 is a plan view showing the surface side of the semiconductor chip shown in FIG. 3. FIG. 6 is an enlarged cross-sectional view taken along the line A-A in FIG. 5.

As shown in FIG. 5, the semiconductor chip 3 has a quadrangular planar shape. The semiconductor chip 3 is, for example, from about 7 mm to 20 mm on a side. The semiconductor chip 3 shown in FIG. 6 has a thickness, that is, a distance from the surface 3a to the back surface 3b, of for example, from about 250 µm to 800 µm. The total thickness of a plurality of wiring layers stacked one after another on the semiconductor substrate 31 shown in FIG. 6 is from about 1 µm to several µm which corresponds to about 1/50 or less compared with the total thickness of the semiconductor chip 3. In FIG. 6, a portion of the wiring layers is enlarged in order to facilitate viewing of the structure of the wiring layers.

The semiconductor chip 3 has, as shown in FIG. 6, a semiconductor substrate 31 which is a base material made of, for example, silicon (Si) and the semiconductor substrate 31 has, on the main surface (semiconductor element formation surface) 31a thereof, a semiconductor element layer 31b. The semiconductor element layer 31b has thereon a plurality of semiconductor elements such as transistors or diodes, though they are not illustrated. The semiconductor elements formed on the semiconductor element layer 31b are electrically connected with the pads 3PD via wirings (chip wirings) 32 formed on the main surface 31a, respectively.

In the present embodiment, a semiconductor element formation surface formed on one of the surfaces of the semiconductor substrate 31 is described as a main surface 31a. On the other hand, the surface 3a of the semiconductor chip 3 is an exposed surface located on the side of the main surface 31a of the semiconductor substrate 31.

The wiring 32 is a buried wiring made of, for example, copper (Cu). The buried wiring is formed using a so-called damascene technology, more specifically, a technology of forming a trench or hole in an insulating layer 33 formed on the side of the main surface 31a, filling this trench or hole with a conductive metal material such as copper, and then polishing the surface. The wiring 32 is formed in a plurality of wiring layers and the wirings 32 of each of the wiring layers are electrically connected with each other through a via serving as an interlayer conducting path. One of the end portions of a wiring route including the wirings 32 is connected with the semiconductor element and the other end portion is electrically connected with the pad 3PD. In the semiconductor chip 3, two or more wiring layers are stacked one after another to secure the drawing space of the above-mentioned wiring route.

The insulating layer 33 is an insulating film for electrically insulating between the wirings 32 of each of the wiring layers or between wiring layers stacked one after another. The insulating layer provided between the wiring layers is usually an inorganic insulating layer composed of a semiconductor compound such as silicon oxide ($SiO_2$). From the standpoint of improving the adhesion with the semiconductor substrate 31 which is a base material, a semiconductor compound is preferably used. With recent improvement in integration degree of an integrated circuit formed on a semiconductor chip (semiconductor device), it becomes more important to prevent generation of noises in a circuit formed on the semiconductor chip. These noises are caused, for example, due to generation of a parasitic capacitance between the wirings 32 stacked in a plurality of layers or between the wiring 32 and the semiconductor element. In the present embodiment, therefore, an insulating film made of a low-dielectric-constant material having a specific dielectric constant lower than that of $SiO_2$ is used as an interlayer insulating film arranged between the wirings 32 in each of the wiring layers.

Examples of the material configuring the insulating layer 33 include SiOC, SiOF, SiLK, SiCN, methyl-containing $SiO_2$, and MSQ (methyl silsesquioxane). The insulating layers made of such low dielectric constant materials, respectively, have a specific dielectric constant smaller than that of an insulating layer made of $SiO_2$ (having a specific dielectric constant of from about 3.9 to 4). This makes it possible to prevent or suppress generation of a parasitic capacitance between the wirings 32 arranged in each of the wiring layers. This means that generation of noises can be prevented or suppressed.

Pads 3PD are formed in the outermost surface wiring layer, which is most distant from the main surface 31a among the wiring layers stacked over the main surface 31a. The pads 3PD are each made of, for example, aluminum (Al) and are covered with an insulating layer (surface insulating layer) 34 which will be a passivation film for protecting the main surface 31a. This insulating layer 34 can be made of a material of the same kind as that of the insulating layer 33 from the standpoint of improving the adhesion between the insulating layer 34 and the insulating layer 33. It may however be made of a semiconductor oxide such as $SiO_2$ or a semiconductor nitride such as SiN because of a relatively small influence on the noises in the semiconductor chip 3 compared with the insulating layer 33 which is an interlayer insulating film. In this case, the specific dielectric constant of the insulating layer 33 becomes lower than that of the insulating layer 34.

In order to allow the pads 3PD to function as external terminals, an opening portion is formed in a part of the insulating layer 34 and a portion of each of the pads 3PD is exposed from the opening portion of the insulating layer 34. The portion of the pad 3PD exposed from the opening portion has thereon a protruding electrode 3BP. In the example shown in FIG. 6, the protruding electrode 3BP is a columnar electrode (copper pillar electrode) obtained by forming a metal material such as copper (Cu) in a columnar shape. The protruding electrode 3BP has however various modification examples in addition to the example shown in FIG. 6. For example, instead of the columnar electrode shown in FIG. 6, a so-called stud bump may be formed on the pad 3PD by melting an end portion of a wire made of gold and then pressure bonding the resulting ball to the surface of the pad 3PD.

A region having therein a plurality of pads 3PD has therearound metal members so as to continuously surround therewith the region having the pads 3PD therein. This metal member is called "seal ring (also called "guard ring")" 3GR. It is a conductor pattern made of a metal of the same kind as that of the wirings 32 and the pads 3PD and extends from the surface of the insulating layer 33 to the semiconductor element layer 31b. As shown in FIG. 5, the seal ring 3GR is arranged at the peripheral portion of the semiconductor chip 3 so as to continuously surround the center portion of the semiconductor chip 3 with the seal ring in plan view. Each of the plurality of pads 3PD is, in plan view, arranged inside the seal ring 3GR. In other words, the seal ring 3GR is formed on the side closer to the peripheral portion of the semiconductor chip 3 than the plurality of pads 3PD. This makes it possible to prevent or suppress propagation of the noises (for example, static electricity) from the outside of the semiconductor chip 3 to main circuits of the semiconductor chip 3. In addition, the seal ring 3GR thus formed can prevent or suppress water or the like from entering a region inside the seal ring 3GR.

A plurality of metal patterns (conductive members) MP made of a metal (aluminum in the present embodiment) of the same kind as that of the pads 3PD is arranged at the peripheral portion (chip end portion) on the main surface 31a. The plurality of metal patterns MP includes metal pads for test (for element evaluation) to be performed in a wafer stage in a manufacturing method of a semiconductor device according to the present embodiment which will be described later. The metal pads for test are called TEG (Test Element Group).

The metal patterns MP such as TEG patterns are elements for evaluation in the manufacturing stage of the semiconductor chip 3 so that they are electrically isolated from a circuit formed on the semiconductor chip 3. The metal patterns MP are, in plan view, formed on the side closer to the peripheral portion than the seal ring 3GR, in other words, formed between the seal ring 3GR and the side surface 3c of the semiconductor chip 3. In the example shown in FIG. 5, a plurality of metal patterns MP is formed along each of the sides configuring the peripheral portion of the semiconductor chip 3. The reason why the plurality of metal patterns MP including evaluation elements remains at the peripheral portion of each of the semiconductor chip 3 will be described later.

<Method of Manufacturing Semiconductor Device>

Figure 7:
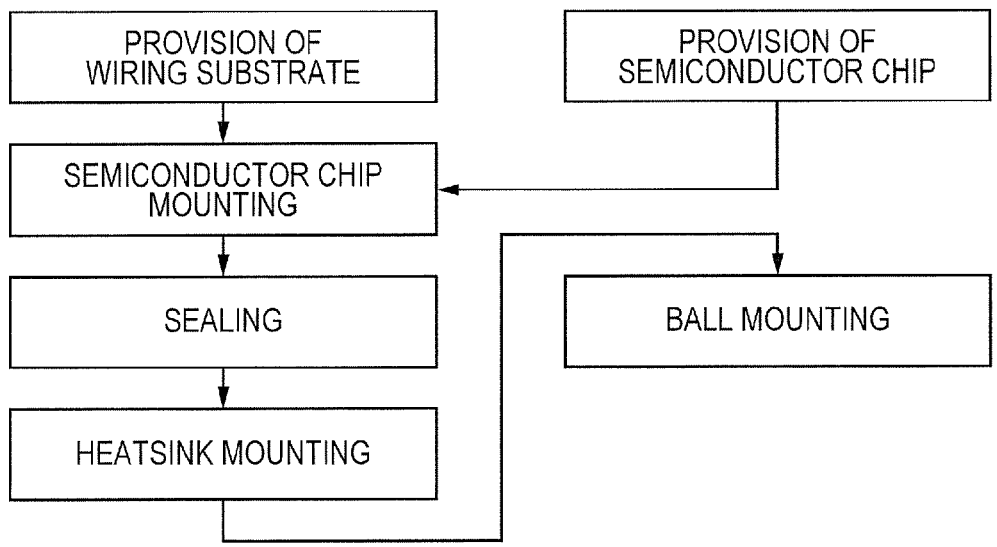
FIG. 7 is an explanatory view showing the outline of manufacturing steps of the semiconductor device described referring to FIGS. 1 to 4.
Figure 8:
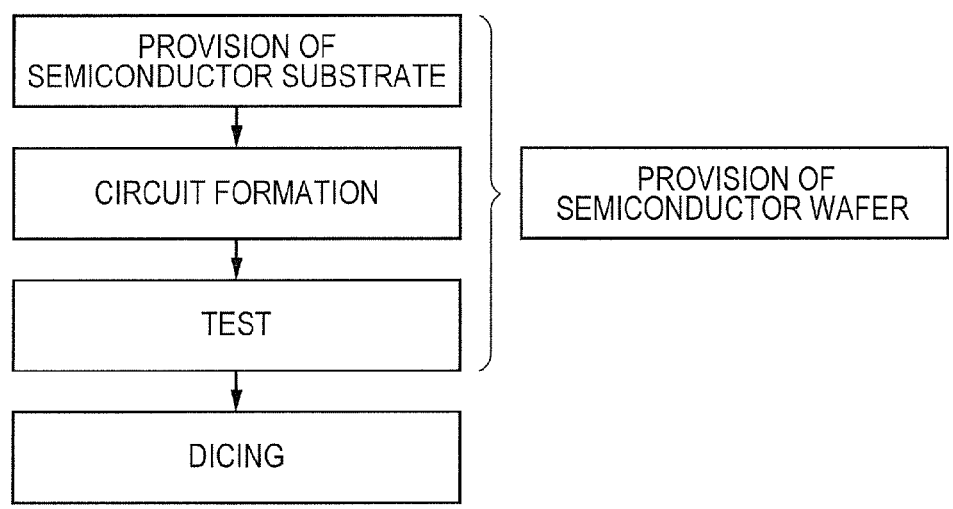
FIG. 8 is an explanatory view showing a substep included in the semiconductor chip provision step shown in FIG. 7.
Figure 9:
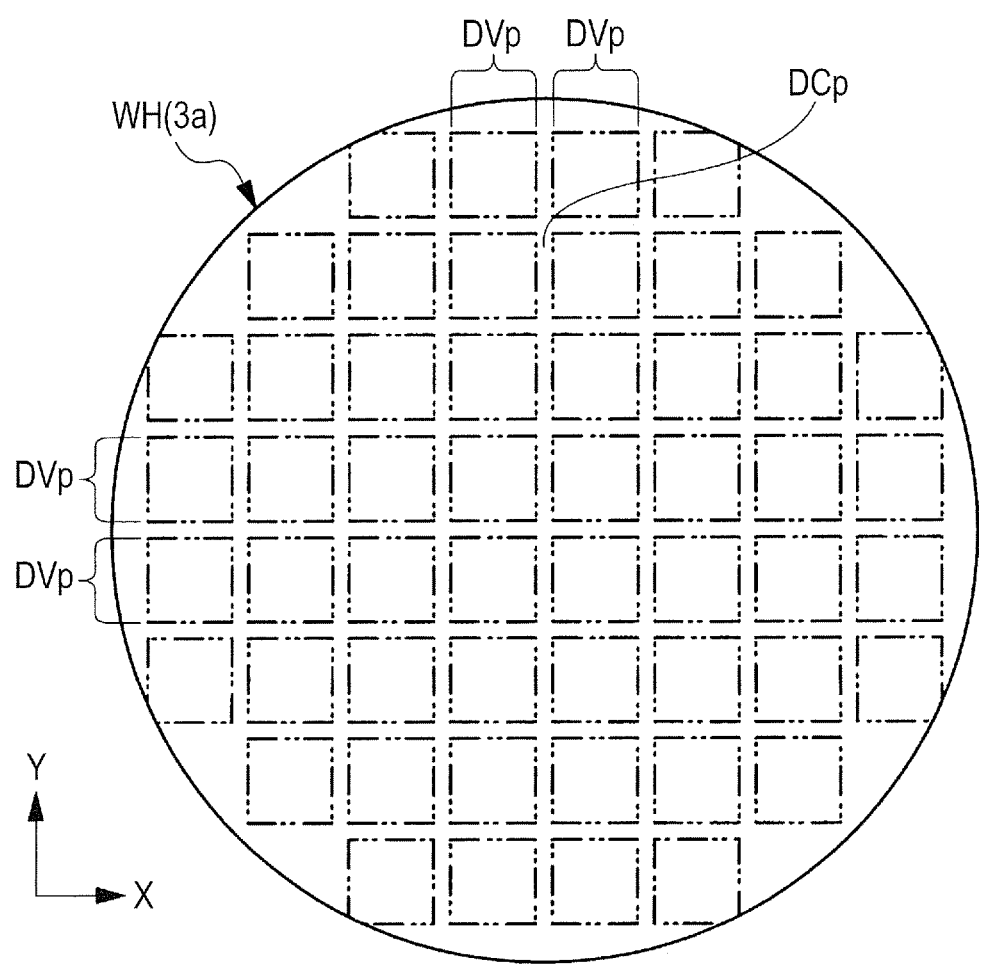
FIG. 9 is a plan view of the surface side of a semiconductor wafer to be provided in the semiconductor wafer provision step shown in FIG. 8.

Manufacturing steps of the semiconductor device 1 described referring to FIGS. 1 to 4 will next be described. FIG. 7 is an explanatory view showing the outline of manufacturing steps of the semiconductor device described referring to FIGS. 1 to 4. FIG. 8 is an explanatory view showing a substep included in the semiconductor chip provision step shown in FIG. 7. FIG. 9 is a plan view of the surface side of a semiconductor wafer to be provided in the semiconductor wafer provision step shown in FIG. 8. In the example shown in FIG. 7, the method of manufacturing a semiconductor device according to the present embodiment includes a wiring substrate provision step, a semiconductor chip provision step, a semiconductor chip mounting step, a sealing step, a heatsink mounting step, a ball mounting step, and a singulation step. This section describes, prior to describing the flow of the fabrication steps of the semiconductor device, the semiconductor chip provision step based on the flow shown in FIG. 8.

<Semiconductor Chip Provision Step>

The semiconductor chip provision step shown in FIG. 7 includes a semiconductor wafer provision step for providing a semiconductor wafer having, in each of the plurality of chip regions DVp (refer to FIG. 9) thereof, circuits including semiconductor elements and a dicing step for cutting the semiconductor wafer along a dicing region DCp between the chip regions DVp to divide the wafer into individual chip regions DVp. The semiconductor wafer provision step shown in FIG. 8 includes a semiconductor substrate provision step for providing a semiconductor substrate, a circuit formation step for forming a circuit including semiconductor elements on the semiconductor element formation surface of the semiconductor substrate, and a testing step for evaluating the circuit formed on the semiconductor substrate.

Figure 10:
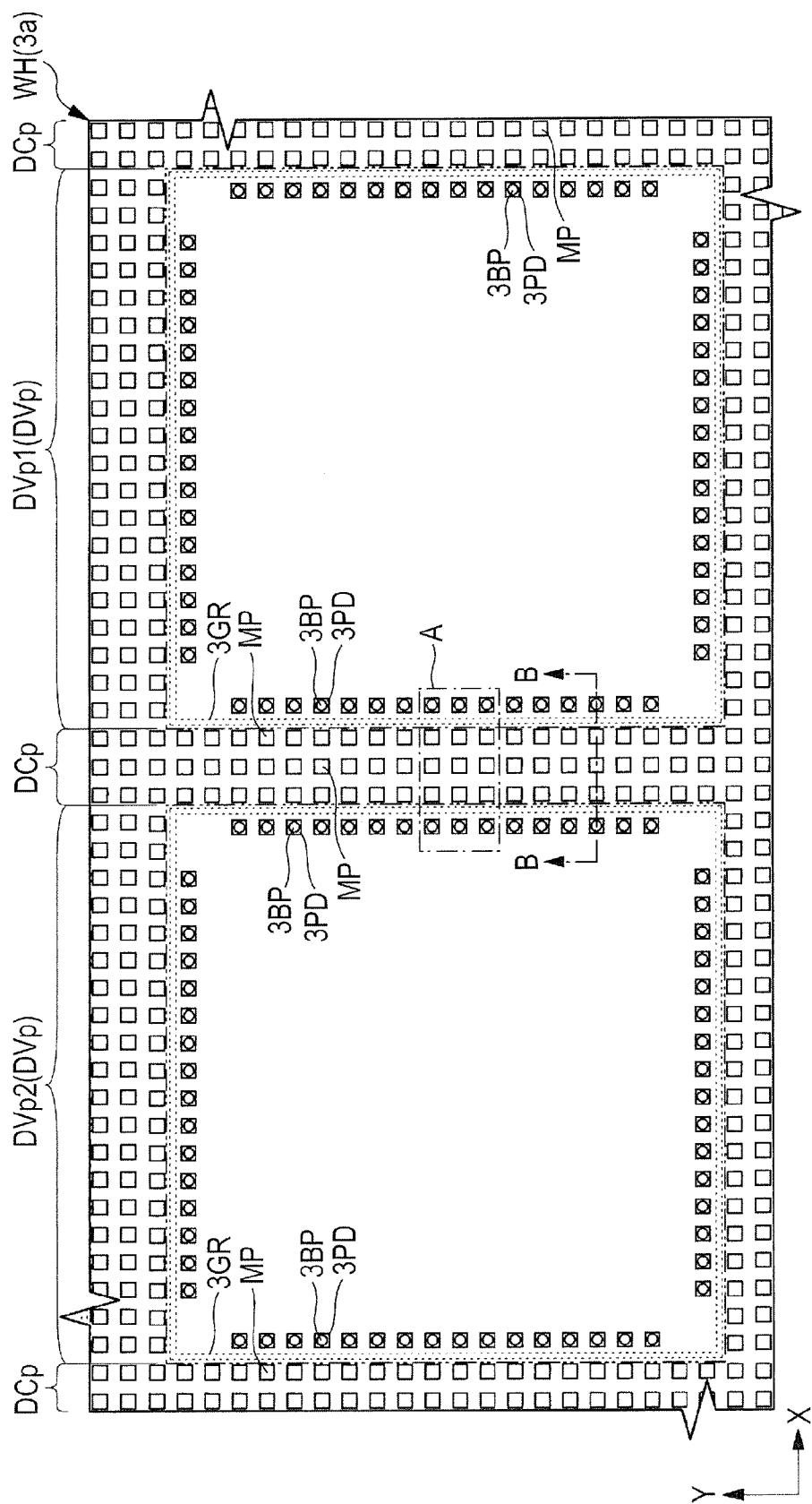
FIG. 10 is an enlarged plan view of two of the plurality of chip regions shown in FIG. 9.
Figure 11:
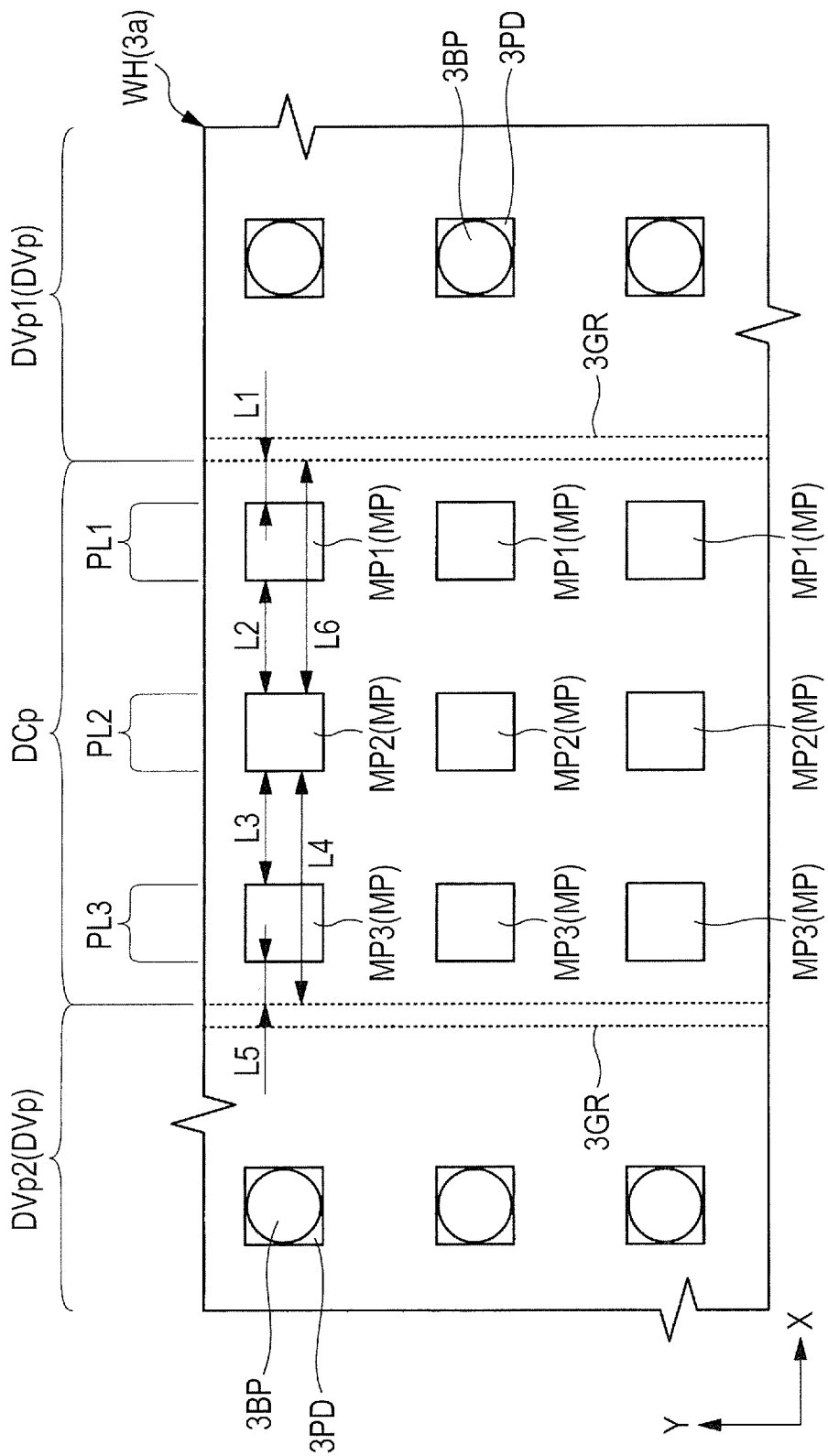
FIG. 11 is a further enlarged plan view of Portion A of FIG. 10.
Figure 12:
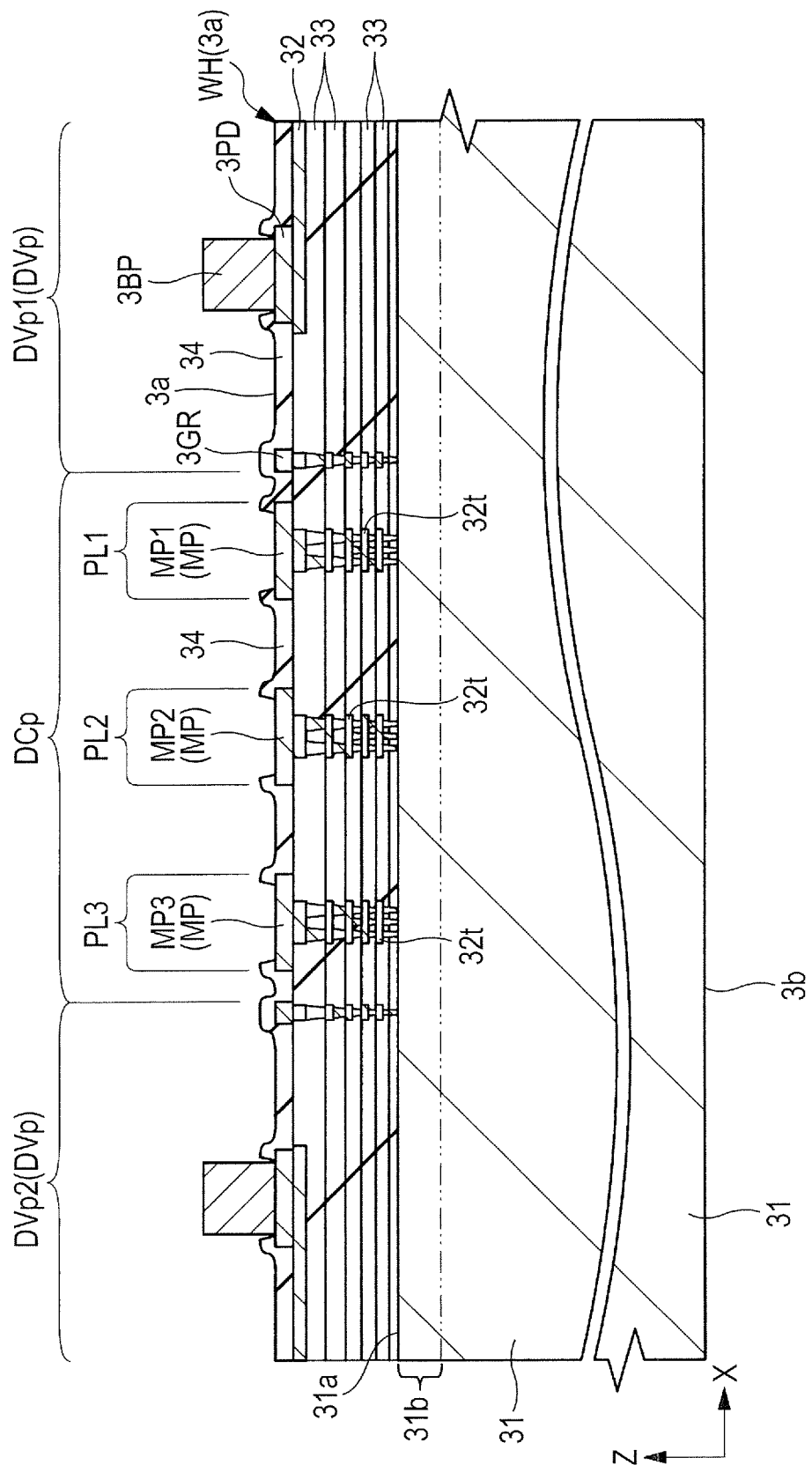
FIG. 12 is an enlarged cross-sectional view taken along the line B-B of FIG. 10.

In the semiconductor wafer provision step shown in FIG. 8, the wafer (semiconductor wafer) WH shown in FIGS. 9 to 12 is provided. FIG. 10 is an enlarged plan view showing two of the plurality of chip regions shown in FIG. 9. FIG. 11 is a further enlarged plan view of Portion A of FIG. 10. FIG. 12 is an enlarged cross-sectional view taken along the line B-B of FIG. 10. In FIG. 12, in order to show that the wiring layer formed over the semiconductor substrate 31 is a film stack made of a plurality of layers, a ratio (which will hereinafter be called "aspect ratio") on the drawing is adjusted so as to make the length in the direction Z greater relative to the length in the direction X in FIG. 12. For example, in the example shown in FIG. 12, the distance from the main surface 31a of the semiconductor substrate 31 to the surface 3a of the wafer WH is from about 1 μm to several μm. On the other hand, the width of the dicing region DCp in the direction X is from about 250 μm to 350 μm. Also in the drawings (FIGS. 13 and 14 described later) corresponding to the wafer WH shown in FIG. 12, an aspect ratio is shown after adjustment. Also in FIG. 6, the aspect ratio is adjusted.

The wafer WH provided in the present embodiment has a surface 3a having a substantially circular planar shape and a back surface 3b (refer to FIG. 12) positioned on a side opposite to the surface 3a. The surface 3a and the back surface 3b of the wafer WH respectively correspond to the surface 3a and the back surface 3b of the semiconductor chip 3 shown in FIG. 6.

The wafer WH has a plurality of chip regions DVp and the chip regions DVp each correspond to the semiconductor chip 3 shown in FIGS. 5 and 6. Each of the plurality of chip regions DVp therefore has therein the semiconductor element, wirings 32, insulating layer 33, pads 3PD, and insulating layer 34 described referring to FIG. 6. The pads 3PD each have thereon the protruding electrode 3BP.

Two of the chip regions DVp adjacent to each other, among the plurality of chip regions DVp, have therebetween a dicing region DCp. In other words, as shown in FIGS. 10 to 12, a chip region DVp1 and a chip region DVp2 provided adjacent to the chip region DVp1 in plan view have therebetween the dicing region DCp. The dicing region DCp is arranged in lattice form. In other words, the surface 3a of the wafer WH is divided into a plurality of chip regions DVp, each having a quadrangular planar shape, by the dicing region DCp.

The dicing region DCp is a region to be cut in the dicing step shown in FIG. 8. It is however to be noted that the dicing region DCp is a name of a portion electrically isolated from a circuit formed in the chip region DVp. In the dicing step, therefore, removal of the whole dicing region DCp is not necessary. Although details will be described later, for example, in the present embodiment, a portion of the dicing region DCp is removed along an extending direction of the dicing region DCp and the other portion is not removed in the dicing step shown in FIG. 8.

In the present embodiment, the chip region DVp and the dicing region DCp have therebetween the seal ring 3GR. This means that a region surrounded by the seal ring 3GR is the chip region DVp and a region between two seal rings 3GR adjacent to each other is the dicing region DCp. Further, in a plan view, the boundary between the chip region DVp and the dicing region DCp is delimited by the seal ring 3GR.

The dicing region DCp has therein a plurality of metal patterns MP. At least some of the metal patterns MP are TEG patterns to be used for a test for evaluating whether the semiconductor elements or wirings 32 in the chip region DVp are formed correctly or not. As the metal patterns formed in the dicing region DCp, as well as the above-mentioned TEG patterns, a metal pattern called "mark" to be used for positioning when wiring patterns are formed using photolithography may be formed. In the present embodiment, however, they are not illustrated, and the metal patterns MP are shown as a representative.

The TEG patterns are elements for evaluating components in the circuit formation step shown in FIG. 8. A semiconductor element for evaluation is formed at a position of the semiconductor element layer 31b of the semiconductor substrate 31 shown in FIG. 12 which position overlaps with the dicing region DCp in the thickness direction thereof. A plurality of wiring layers stacked over the main surface 31a of the semiconductor substrate 31 has wirings 32t electrically connected with the semiconductor element for evaluation and the metal patterns MP.

In the present embodiment, as shown in FIGS. 11 and 12, the plurality of metal patterns MP is arranged in a plurality of columns in one dicing region DCp. In the example shown in FIGS. 11 and 12, the number of the columns of the plurality of metal patterns MP is three.

More specifically, the plurality of metal patterns MP includes a plurality of metal patterns (first-column patterns) MP1 arranged in a column (pattern column) PL1 closest to the chip region DVp1. The plurality of metal patterns MP further includes a plurality of metal patterns (second-column patterns) MP2 arranged at a position further from the chip region DVp1 than the metal patterns MP1. The plurality of metal patterns MP still further includes a plurality of metal patterns (third-column patterns) MP3 arranged in a column (pattern column) PL3 closest to the chip region DVp3.

The mode shown in FIGS. 11 and 12 can also be expressed as follows. Described specifically, the column PL1 having therein the plurality of metal patterns MP1 and the column PL3 having therein the plurality of metal patterns MP3 have therebetween the column PL2 and the column PL2 has therein the plurality of metal patterns MP2.

The metal patterns MP such as TEG patterns are members used in the manufacturing steps of the semiconductor chip 3 (refer to FIG. 5) but are not used after completion of the semiconductor chip 3. When the metal patterns MP are arranged in the dicing region DCp as in the present embodiment, therefore, the region to be cut during the manufacturing steps can be utilized as an arrangement space of evaluation elements. In this case, a planar area of the chip region DVp can be reduced because formation of the evaluation element in the chip region DVp is not necessary. This results in an increase in the number of the semiconductor chips 3 obtained in the surface 3a of the wafer WH.

In order to satisfy the demand for semiconductor devices having higher function, however, there is a tendency of increasing the number of semiconductor element-containing circuits included in the semiconductor chip 3. Increasing the number of circuits included in the semiconductor chip 3 requires an increase in the number of evaluation elements in accordance with the number of circuits. In addition, increasing the number of circuits which the semiconductor chip 3 has requires an increase in the planar area of the chip region DVp.

As described above, an increase in the planar area of the chip region DVp provided on the wafer WH leads to an increase in the occupied area of the chip region DVP in the surface 3a of the wafer WH. In other words, the occupied area of the dicing region DVp in the surface 3a of the wafer WH shows a relative decrease. Since the planar area of each of the TEG patterns is determined in accordance with the requirement in the testing step, it is difficult to drastically decrease the planar area of the TEG patterns. It is therefore necessary to secure an arrangement space of a number of the metal patterns MP around each of the plurality of chip regions DVp.

In the present embodiment, as shown in FIG. 11, a plurality of metal patterns MP is therefore arranged in a plurality of columns in one dicing region DCp. A larger number of metal patterns MP can be formed around the chip region DVp compared with arrangement of a plurality of metal patterns MP in a single column in one dicing region DCp.

In the present embodiment, an increase in the planar area of the dicing region DCp is suppressed by decreasing the planar area and arrangement distance of the metal patterns MP. For example, in the example shown in FIG. 11, the metal patterns MP each have a quadrangular planar shape and are about 60 μm on a side. The distance between two metal patterns MP adjacent to each other, for example, the distance (Distance L2) between the metal patterns MP1 and the metal patterns MP2 is from about 50 μm to 60 μm. In the example shown in FIG. 11, the metal patterns MP are arranged with an equal interval. Accordingly, the distance (Distance L2) between Column PL1 and Column PL2 is equal to the distance (Distance L3) between Column PL2 and Column PL3. The distance between the metal patterns adjacent to each other in an arrangement direction of each column (direction Y in FIG. 11) is also from about 50 μm to 60 μm.

In the present embodiment, as described later, among the plurality of metal patterns MP, neither the metal patterns MP1 formed in Column PL1 nor the metal patterns MP3 formed in Column PL3 are removed in the dicing step shown in FIG. 8. As shown in FIG. 11, therefore, the distance (Distance L1) between the metal patterns MP1 formed in Column PL1 and the chip region DVp1 can be reduced. This means that the distance (Distance L1) between the metal patterns MP1 and the chip region DVp1 is smaller than the distance (Distance L2) between the metal patterns MP1 and the metal patterns MP2. The distance (Distance L1) between the metal patterns MP1 and the chip region DVp1 is smaller than the distance (Distance L4) between the metal patterns MP2 and the chip region DVp2.

Similarly, in the present embodiment, the distance (Distance L5) between the metal patterns MP3 formed in Column PL3 and the chip region DVp2 can be reduced. This means that the distance (Distance L5) between the metal patterns MP3 and the chip region DVp2 is smaller than the distance (Distance L3) between the metal patterns MP3 and the metal patterns MP2. The distance (Distance L5) between the metal patterns MP3 and the chip region DVp2 is smaller than the distance (Distance L6) between the metal patterns MP2 and the chip region DVp1.

By decreasing the distance between the metal patterns MP which are not removed in the dicing step and the chip region DVp as described above, an increase in the area of the dicing region DCp can be suppressed.

The wafer WH shown in FIGS. 9 to 12 is formed as described below. First, in the semiconductor substrate provision step shown in FIG. 8, a substantially circular semiconductor substrate 31 (refer to FIG. 12) serving as a base material is provided. The semiconductor substrate 31 is a circular plate made of, for example, silicon (Si) and it has a main surface 31*a* and a back surface 3*b* which is a surface on the side opposite to the main surface 31*a*.

Next, in the circuit formation step shown in FIG. 8, as shown in FIG. 12, layers starting from a semiconductor element layer 31*b* to an insulating layer 34 are formed on the side of the main surface 31*a* in each of a plurality of chip regions DVp. Described specifically, a plurality of semiconductor elements and a plurality of wiring layers to be electrically connected therewith are stacked one after another on the main surface 31*a* of the semiconductor substrate 31 to form a circuit. Simultaneously with formation of members in the chip regions DVp, wirings 32*t* and metal patterns MP are formed in the dicing region DCp. At the peripheral portion of each of the chip regions DVp, a seal ring 3GR is formed along the outer periphery of each of the chip regions DVp having a quadrangular planar shape so as to penetrate through the plurality of wiring layers. Metal patterns configuring the seal ring 3GR are formed in each of the wiring layers simultaneously with the members formed in the chip regions DVp.

Details of the method of forming the members such as the semiconductor element, pads 3PD, wirings 32, insulating layer 33, and insulating layer 34 in the chip regions DVp are not particularly limited. A known method of forming an integrated circuit on a semiconductor wafer can be employed so that a detailed description of it is omitted.

Next, a test is performed to evaluate whether patterns such as semiconductor element and wiring patterns are formed in the chip region DVp correctly or not. In this step, electrical characteristics of a test semiconductor element to be electrically connected with the metal patterns MP are observed, for example, by bringing an unillustrated probe terminal into contact with the metal patterns MP exposed from the insulating layer 34 on the surface 3*a* of the wafer WH.

Next, a protruding electrode 3BP is formed on the surface of the pad 3PD exposed from the insulating layer 34 on the surface 3*a* of the wafer WH. The columnar protruding electrode 3BP as shown in FIG. 12 is formed, for example, in the following manner. Described specifically, after formation of an unillustrated resist film so as to cover therewith the surface 3*a* of the wafer WH, a through-hole is formed in the resist film. At this time, the pad 3PD is exposed from the resist film at one end of the through-hole. Next, a metal such as copper (Cu) is formed in the through-hole formed in the resist film. The through-hole is filled with the metal, for example, by a film formation technology such as plating. Next, the resist film is removed to complete the formation of the columnar protruding electrode 3BP. Although not illustrated in FIG. 12, a metal layer made of a solder material is sometimes formed on the uppermost layer of the protruding electrode 3BP. In this case, in the semiconductor chip mounting step shown in FIG. 7, the protruding electrode 3BP and a terminal on the side of the wiring substrate can easily be connected with each other. This step may be performed prior to the above-mentioned testing step using the metal patterns MP.

FIG. 12 shows an example of forming the columnar protruding electrode 3BP on the pad 3PD, but various modification examples in addition to the columnar shape can be applied to the shape of the protruding electrode 3BP. For example, a so-called ball bonding technology, that is, a technology of melting the end of a metal wire into a ball and then bonding the ball to the pad 3PD can be used as a technology of forming the protruding electrode 3BP. In this case, the shape of the protruding electrode 3BP conforms to the shape of a capillary used at the time of bonding the ball to the pad 3PD. The protruding electrode 3BP formed using the ball bonding technology is called "stud bump".

When the semiconductor chip 3 (refer to FIG. 4) and the wiring substrate 2 (refer to FIG. 4) are connected with each other via an unillustrated wire as a modification example of the present embodiment, the step of forming the protruding electrode 3BP can be omitted.

Next, in the dicing step shown in FIG. 8, the wafer WH shown in FIG. 9 is cut along the dicing region DCp and divided into individual chip regions DVp. Examples of the method of cutting the wafer WH include a machining treatment method in which the wafer is cut by subjecting the dicing region DCp to machining treatment, a laser irradiation treatment method in which the wafer is melt-cut by irradiating the dicing region DCp with laser, and a method of using the laser irradiation treatment method and the machining treatment method in combination. In the laser irradiation treatment method, the wafer WH is cut by removing a member arranged in the dicing region DCp of the wafer WH by using energy of laser. In the machining treatment method, on the other hand, a disc-shaped machining jig called "dicing blade" travels while turning along the dicing region DCp to cut the wafer WH. In the present embodiment, a description will be made with the method of using laser irradiation treatment and machining treatment method in combination as a typical example.

As described above, since the plurality of metal patterns MP formed in the dicing region DCp and shown in FIG. 11 are used in the manufacturing steps of the semiconductor chip 3 (refer to FIG. 5), all the metal patterns MP are preferably removed in the present step. It has however been found that when the metal patterns MP are arranged in a plurality of columns in the dicing region DCp as in the present embodiment, the following problem occurs.

Described specifically, even if the metal patterns MP are arranged in a plurality of columns, the width of the dicing region DCp is preferably minimized from the standpoint of improving the number of the semiconductor chip 3 (refer to FIG. 5) obtained from one wafer WH. As a result, the distance (Distance L1 and Distance L5 in the example shown in FIG. 11) between the metal patterns MP arranged in a column closest to the chip region DVp and the chip region DVp is smaller than the distance (Distance L2 and Distance L3 in the example shown in FIG. 11) between two metal patterns MP adjacent to each other.

In the dicing step, in order to remove all the metal patterns MP, it is necessary to completely remove the region between Column PL1 and the chip region DVp1 and the region between Column PL3 and the chip region DVp2, each shown in FIG. 11. Distance L1 and Distance L5 are each smaller than 20 μm so that an alignment margin of a cutting position is small. Due to the misalignment of the cutting position, some of the metal patterns MP remain without being removed and the cut surface of the metal patterns MP may be exposed at the peripheral portion of the individual semiconductor chips 3 (refer to FIG. 5) thus obtained. Partially cut metal patterns MP dropping off from the insulating layer 33 may become metal foreign matters. It has been found that even after success in alignment, chipping or cracks are likely to occur because the volume of a portion remaining outside the chip region DVp after the dicing step is small.

The present inventors have found the following technology capable of overcoming the above-mentioned problem. Described specifically, among the metal patterns arranged in a plurality of columns in the dicing region DCp, some columns of the metal patterns are removed in the dicing step, while some of the other columns of the metal patterns remain without being removed in the dicing step. In other words, among the metal patterns MP arranged in a plurality of columns, some columns of the metal patterns MP are incorporated as a part of the semiconductor chip 3 shown in FIG. 5.

In the example of the present embodiment, among the metal patterns MP arranged in three columns as shown in FIG. 11, the metal patterns MP2 formed in Column PL2 are removed in the dicing step and the metal patterns MP1 formed in Column PL1 and the metal patterns MP3 formed in Column PL3 remain without being removed.

In the present embodiment, Distance L2 and Distance L3 are larger than Distance L1 and Distance L5 in FIG. 11 so that an alignment margin of the cutting position is large. It is therefore possible to inhibit the metal patterns MP1 and the metal patterns MP3 from being damaged in the dicing step. When the metal patterns MP1 and the metal patterns MP3 which are left at the peripheral portion of the chip region DVp are inhibited from being damaged, it is possible to inhibit some of the damaged metal patterns MP1 and the metal patterns MP3 from becoming metal foreign matters. In addition, since the volume of a portion which has remained outside the chip regions DVp after the dicing step is large, chipping or cracks are hard to occur. Therefore, the semiconductor device 1 (refer to FIG. 4) having the semiconductor chip 3 (refer to FIG. 4) mounted thereon can have improved reliability.

When neither the metal patterns MP1 nor the metal patterns MP3 are removed in the dicing step, the metal patterns MP1 and the metal patterns MP3 can be approximated to the side of the chip regions DVp, respectively. This means that Distance L1 and Distance L5 can be made smaller because they do not require consideration of a processing margin at the time of dicing. This makes it possible to enlarge Distance L2 and Distance L3 and thereby enlarge an alignment margin of the cutting position further.

Figure 13:
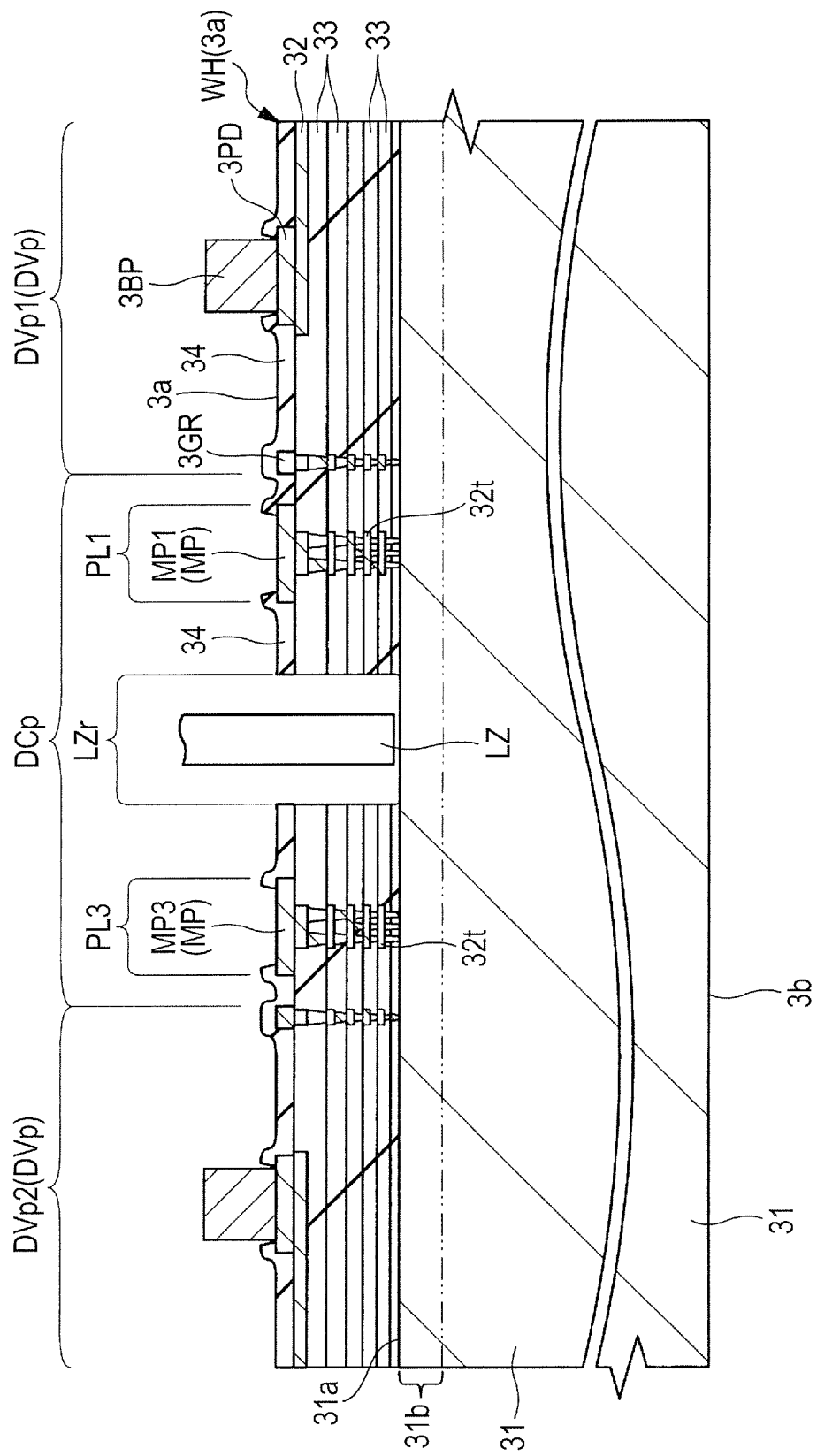
FIG. 13 is an enlarged cross-sectional view showing the semiconductor wafer of FIG. 12 from which a portion of the dicing region has been removed by irradiating the wafer with laser radiation from the surface side thereof.

The dicing step of the present embodiment will next be described in detail. FIG. 13 is an enlarged cross-sectional view showing the semiconductor wafer of FIG. 12 from which a portion of the dicing region has been removed by irradiating the wafer with laser radiation from the surface side thereof.

As shown in FIG. 13, the dicing step of the present embodiment includes a step of irradiating the wafer WH with a laser light LZ from the side of the surface 3a of the wafer to the dicing region DCp. In this laser irradiation step, the metal patterns MP2 formed in Column PL2 and the wirings 32t connected with the metal patterns, each shown in FIG. 12 are removed. In addition, in the laser irradiation step, neither the metal patterns MP1 formed in Column PL1 nor the metal patterns MP3 formed in Column PL3 are irradiated as shown in FIG. 13. Further in the laser irradiation step, neither the wirings 32t to be connected with the metal patterns MP1 nor the wirings 32t to be connected with the metal patterns MP3 are irradiated with a laser light Lz. After the laser irradiation step, the metal patterns MP1 and the metal patterns MP3 therefore remain without being damaged adjacently to the chip regions DVp.

The width (length in a direction orthogonal to an extending direction of the dicing region DCp) of a region LZr to be irradiated with the laser light LZ in the laser irradiation step is greater than the width of the metal patterns MP shown in FIG. 12. In the example shown in FIG. 13, for example, the width of the irradiation region LZr is from about 70 μm to 80 μm. The irradiation width of the laser light LZ is smaller than the width of the irradiation region LZr and is, for example, from about 10 μm to 20 μm. In the present embodiment, the irradiation region LZr of the dicing region DCp is irradiated with the laser light LZ in a plurality of times. By this irradiation, the whole irradiation region LZr is irradiated the laser light LZ.

When the irradiation width with the laser light LZ is smaller as in the above example, for example, irradiation of the whole dicing region DCp with the laser light LZ requires an increase in the number of irradiation times of the laser light LZ and thus deteriorates the working efficiency of the laser irradiation step. When the present embodiment is employed, however, the irradiation region LZr does not include a portion of the dicing region DCp having therein the metal patterns MP1 and the metal patterns MP3. As a result, the number of irradiation times of the laser light LZ can be reduced and the working efficiency of the laser irradiation step can be improved.

In the laser irradiation step of the present embodiment, the wafer WH is not cut in the thickness direction thereof and it is irradiated with the laser light LZ to a depth enough to expose the main surface 31a of the semiconductor substrate 31. In the present embodiment, in the machining step which will be described later, the irradiation region LZr is machined after irradiation with the laser light LZ. In this step, therefore, it is only necessary that most of the metal patterns MP2, the wirings 32t, and the insulating layer 33 of the irradiation region LZr are removed. In a modification example, therefore, the insulating layer 33 or the wirings 32t in the vicinity of the main surface 31a may partially remain without exposing the main surface 31a of the semiconductor substrate 31 in the laser irradiation step.

In the present embodiment, however, the mode of irradiating the wafer with the laser light LZ to the depth enough to expose the main surface 31a of the semiconductor substrate 31 is preferred because of the following reasons.

As in the present embodiment, as described above, a low dielectric constant material having a specific dielectric constant smaller than that of $SiO_2$ is used for the insulating layer 33. This low dielectric constant material usually has a density lower than that of $SiO_2$ and some of the low dielectric constant materials are porous. The insulating layer 33 is therefore structurally fragile. In addition, adhesion at the adhesive interface of the stacked insulating layers 33 is weak. When cutting is performed by bringing a dicing blade into contact with the insulating layers 33 made of the low dielectric constant material, cracks or chipping occurs in the insulating layers 33. The cracks or chipping may lead to exfoliation of the insulating layers 33. The exfoliation of the insulating layers 33 reaching the chip region DVp may become a cause for deteriorating the reliability of the semiconductor chip. In the laser irradiation treatment method, on the other hand, the damage does not easily spread to the periphery of the cut region because the irradiation width of the laser light LZ can be narrowed to focus the energy thereto. The cracks, chipping, or exfoliation of the insulating layers 33 can therefore be suppressed.

Narrowing of the irradiation width of the laser light LZ increases the number of irradiation times and therefore prolongs the treatment time of the laser irradiation step. In the present embodiment, in the machining with a dicing blade, a vulnerable portion (more specifically, the insulating layers 33 stacked over the main surface 31a of the semiconductor substrate 31) is removed using laser and the semiconductor substrate 31 itself is cut with the dicing blade. By such a method, a portion of the insulating layers 33 which remains after the dicing step can be inhibited from damage and a working efficiency can be improved. In the laser irradiation step, only a portion formed in the irradiation region LZr, of the insulating layers 33 formed on the semiconductor substrate 31, may be removed. A portion of the semiconductor substrate 31 on the side of the main surface 31a may therefore be removed by laser irradiation.

Figure 14:
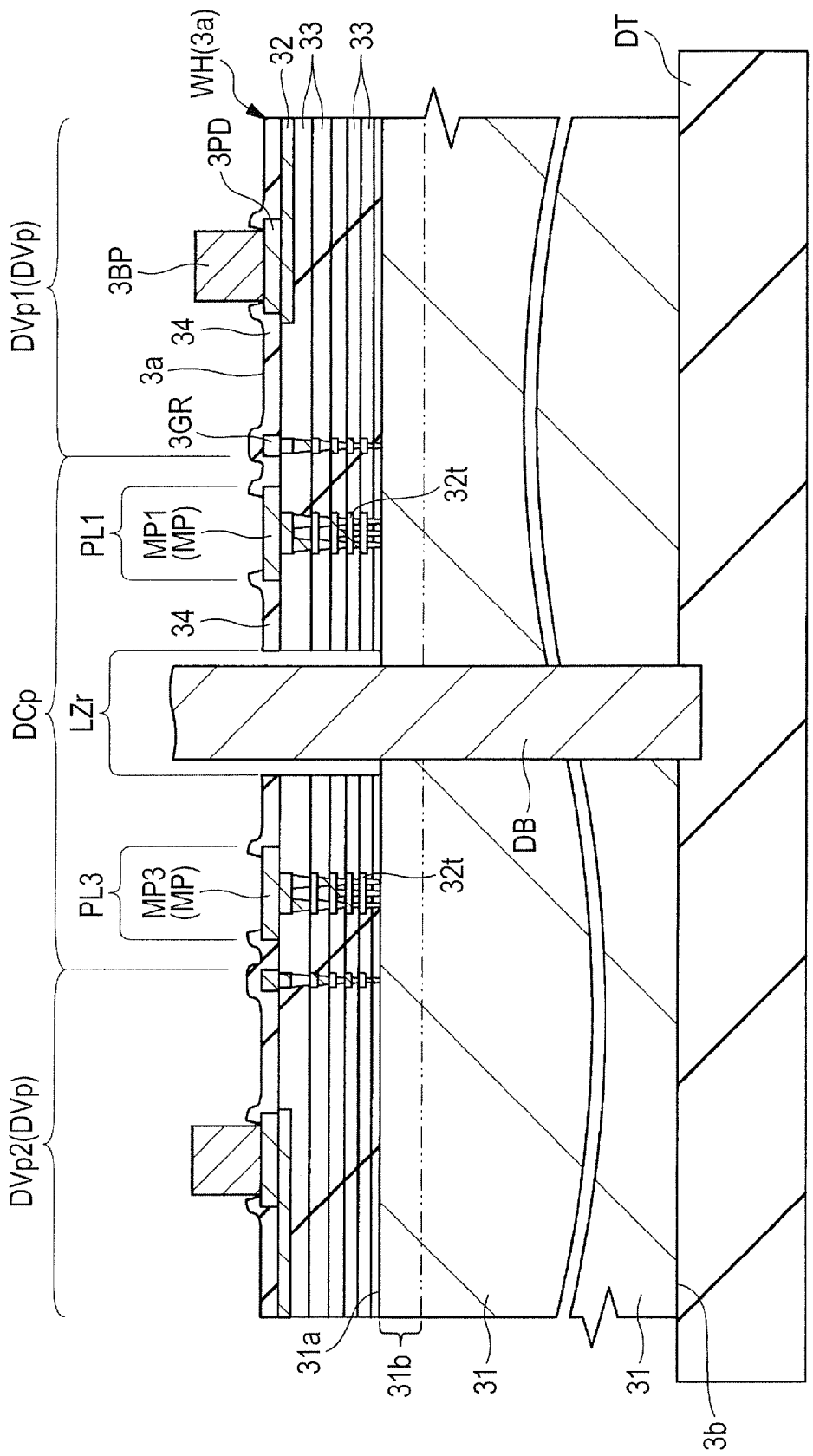
FIG. 14 is an enlarged cross-sectional view showing the semiconductor wafer of FIG. 13 which has been cut with a dicing blade.

As shown in FIG. 14, the dicing step of the present embodiment includes, after the above-mentioned laser irradiation step, a machining step in which the wafer WH is cut by machining with the dicing blade DB. In the present step, the dicing blade DB shown in FIG. 14 is caused to travel along the extending direction of the dicing region DCp shown in FIG. 9. The dicing blade DB is a plate material having a circular planar shape. In the machining step with the dicing blade DB, the peripheral portion of the circular dicing blade having a plurality of abrasive grains firmly attached thereto is pressed against a work piece while rotating in a circumferential direction and thereby, the work piece is machined In the present embodiment, the wafer WH is cut while preventing the dicing blade DB from coming into contact with the metal patterns MP1 formed in Column PL1 and the metal patterns MP3 formed in Column PL3. In order to inhibit the insulating layers 33 from being damaged, the semiconductor substrate 31 is preferably cut without bringing the dicing blade DB into contact with the insulating layers 33. As shown in FIG. 14, therefore, the width of the tip surface of the dicing blade DB, in other words, the width of the machining region is narrower (smaller) than the width of the irradiation region in the laser irradiation step. The dicing blade DB is inserted into a trench formed in the irradiation region LZr of the insulating layer 33 by the above-mentioned laser irradiation step. In the machining step, therefore, the contact of the dicing blade DB to the insulating layers 33 can be suppressed.

When machining is conducted with the dicing blade DB, the greater the width of the tip surface of the dicing blade DB, the greater its influence such as vibration on the periphery of a portion to be machined. From the standpoint of reducing the influence such as vibration on the portion to be machined and inhibiting the insulating layer 33 from being damaged at the time of machining, the width of the dicing blade DB at the tip surface thereof is preferably smaller.

From the standpoint of cutting with precision, the wafer WH is preferably fixed in the cutting processing step. In the example shown in FIG. 14, the wafer WH is cut with a dicing tape DT attached to the back surface 3b of the wafer WH. By attaching and fixing the back surface 3b of the wafer WH to the dicing tape DT, misalignment of the wafer WH in the cutting processing step can be suppressed.

In the machining step, the dicing blade DB is caused to travel (is caused to run) along the extending direction of the dicing region DCp shown in FIG. 9 while rotating it. The wafer WH is cut along the dicing region DCp provided in lattice form and divided into individual chip regions DVp. The chip regions DVp thus obtained by division each correspond to the semiconductor chip 3 shown in FIG. 5.

<Wiring Substrate Provision Step>

Figure 15:
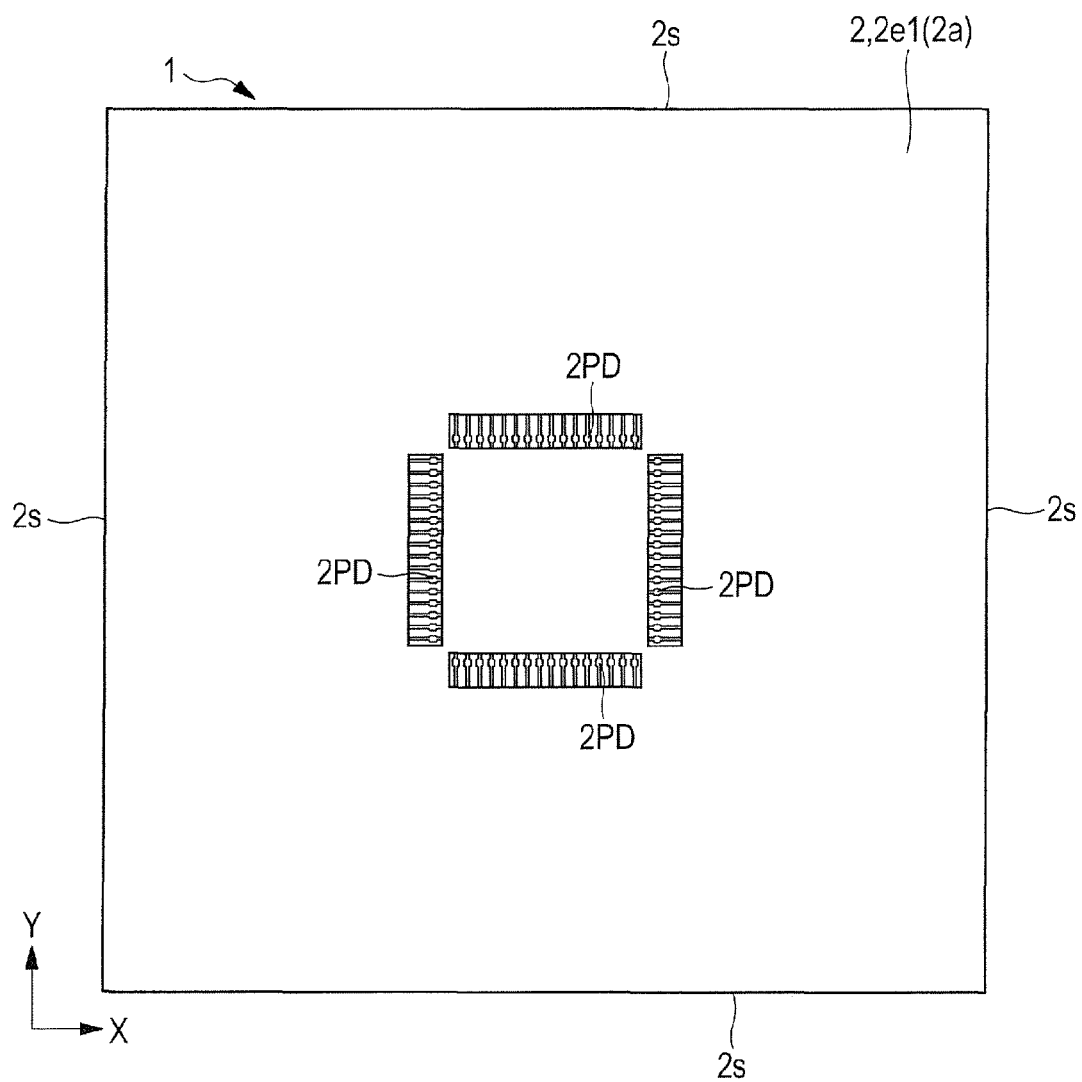
FIG. 15 is a plan view showing the chip mounting surface side of a wiring substrate provided in the wiring substrate provision step shown in FIG. 7.

A fabrication step of the semiconductor device shown in FIGS. 1 to 4 will next be described along the flow shown in FIG. 7. FIG. 15 is a plan view showing the chip mounting surface side of a wiring substrate provided in the wiring substrate provision step shown in FIG. 7. In the wiring substrate provision step shown in FIG. 7, the wiring substrate 2 described referring to FIG. 15 is provided. The wiring substrate 2 shown in FIG. 15 is the same as the wiring substrate 2 described referring to FIGS. 1 to 4. As a modification example of the present embodiment, collective fabrication of a plurality of products, that is, fabrication with a so-called multiple substrate may be employed. In the present embodiment, as one example, a mode of individual fabrication of products will be described.

The wiring substrate 2 has an upper surface 2a which is a chip mounting surface, a lower surface 2b (refer to FIG. 4) which is a surface on the side opposite to the upper surface 2a, and a side surface 2s arranged between the upper surface 2a and the lower surface 2b and it has, in plan view, a quadrangular outer shape.

The wiring substrate 2 is, on the side of the upper surface 2a, covered with a solder resist film (insulating film) 2e1 and a plurality of bonding pads 2PD is exposed from an opening portion formed in the solder resist film 2e1. The bonding pads 2PD are interface terminals formed to permit electrical connection of a plurality of protruding electrodes 3BP formed on the semiconductor chip 3 shown in FIG. 6. In the semiconductor chip mounting step shown in FIG. 7, from the standpoint of facilitating connection between the protruding electrodes 3BP to the bonding pads 2PD, an unillustrated solder material is preferably formed on the exposed surface of the bonding pads 2PD.

The bonding pads 2PD are, as described referring to FIG. 4, electrically connected with lands 2LD formed on the side of the lower surface 2b of the wiring substrate 2, respectively. At the stage of the present step, however, the solder balls 4 shown in FIG. 4 are not yet connected with the lands and the lands are exposed. The structure of the wiring substrate 2 other than that described above is as already described using FIGS. 1 to 4 so that an overlapping description is omitted.

<Semiconductor Chip Mounting Step>

Figure 16:
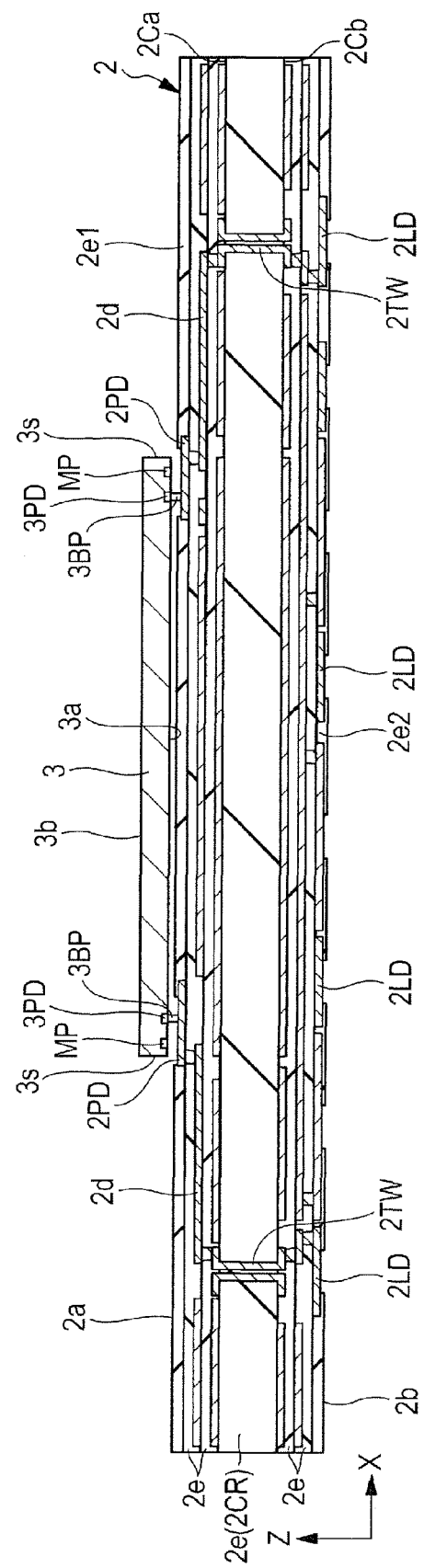
FIG. 16 is a cross-sectional view showing a semiconductor chip mounted on the wiring substrate shown in FIG. 15.

Next, in the semiconductor chip mounting step shown in FIG. 7, as shown in FIG. 16, the semiconductor chip 3 is mounted on the side of the upper surface 2a of the wiring substrate 2. FIG. 16 is a cross-sectional view showing the semiconductor chip mounted on the wiring substrate shown in FIG. 15. In the present step, the semiconductor chip 3 is fixed onto the wiring substrate 2. In the example shown in FIG. 16, the semiconductor chip 3 is mounted on the wiring substrate 2 by a so-called face-down mounting method in which the surface 3a of the semiconductor chip 3 is faced to the upper surface 2a of the wiring substrate 2.

When the face-down mounting method is employed, in the semiconductor chip mounting step, the plurality of pads 3PD which the semiconductor chip 3 has and the plurality of bonding pads 2PD which the wiring substrate 2 has are electrically connected with each other via the protruding electrodes 3BP. In addition, in the stage of the present step, the semiconductor chip 3 is fixed onto the wiring substrate 2 via the plurality of protruding electrodes 3BP.

<Sealing Step>

Figure 17:
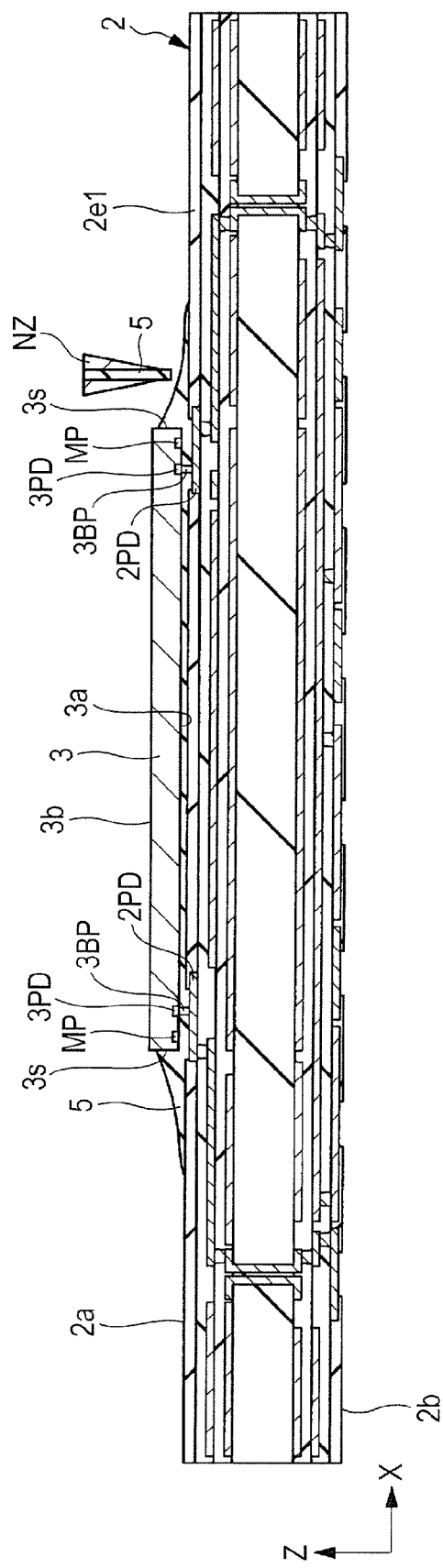
FIG. 17 is a cross-sectional view showing the wiring substrate and the semiconductor chip, each shown in FIG. 16, sealed at the connected portion thereof with a resin arranged between the wiring substrate and the semiconductor chip.

Next, in the sealing step shown in FIG. 7, as shown in FIG. 17, a connected portion at which the semiconductor chip 3 and the wiring substrate 2 are electrically connected with each other is sealed with a resin. FIG. 17 is a cross-sectional view showing the wiring substrate and the semiconductor chip, each shown in FIG. 16, sealed at the connected portion thereof with a resin arranged between the wiring substrate and the semiconductor chip.

In the present embodiment, as shown in FIG. 17, a nozzle NZ is arranged outside the side surface 3s of the semiconductor chip 3 and an underfill resin 5 is discharged from the nozzle NZ. The underfill resin 5 discharged from the nozzle NZ is a liquid. When the underfill resin 5 in liquid form is discharged to the vicinity of the semiconductor chip 3, therefore, the underfill resin 5 penetrates between the semiconductor chip 3 and the wiring substrate 2 through capillary action. The underfill resin 5 is thus arranged so as to fill a space between the surface 3a of the semiconductor chip 3 and the upper surface 2a of the wiring substrate 2. The pad 3PD, the protruding electrode 3BP, and the metal pattern MP of the semiconductor chip 3 and the bonding pad 2Pd of the wiring substrate 2 are each sealed with the underfill resin 5.

Next, energy is applied to the underfill resin 5 to cure the underfill resin 5. For example, the underfill resin 5 contains a thermosetting resin component so that the thermosetting resin component can be cured by heating the underfill resin 5.

In the present embodiment, a post-injection method, that is, a method of injecting the underfill resin 5 after mounting the semiconductor chip 3 on the wiring substrate 2 is described above as a method of sealing, with a resin, the connected portion at which the semiconductor chip 3 and the wiring substrate 2 are electrically connected with each other. The method of sealing, with a resin, the connected portion at which the semiconductor chip 3 and the wiring substrate 2 are electrically connected with each other includes various modification examples.

For example, it is also possible to use a method of applying an insulating material (not illustrated) in film or paste form onto a chip mounting region, which is a region on which the semiconductor chip 3 is to be mounted, prior to the semiconductor chip mounting step shown in FIG. 7, pressing the semiconductor chip 3 onto the insulating material, thereby mounting the semiconductor chip. Such a method of applying a resin material prior to mounting the semiconductor chip 3 is called "pre-application method". In this case, in the sealing step, treatment for curing the insulating material is performed.

<Heatsink Mounting Step>

Figure 18:
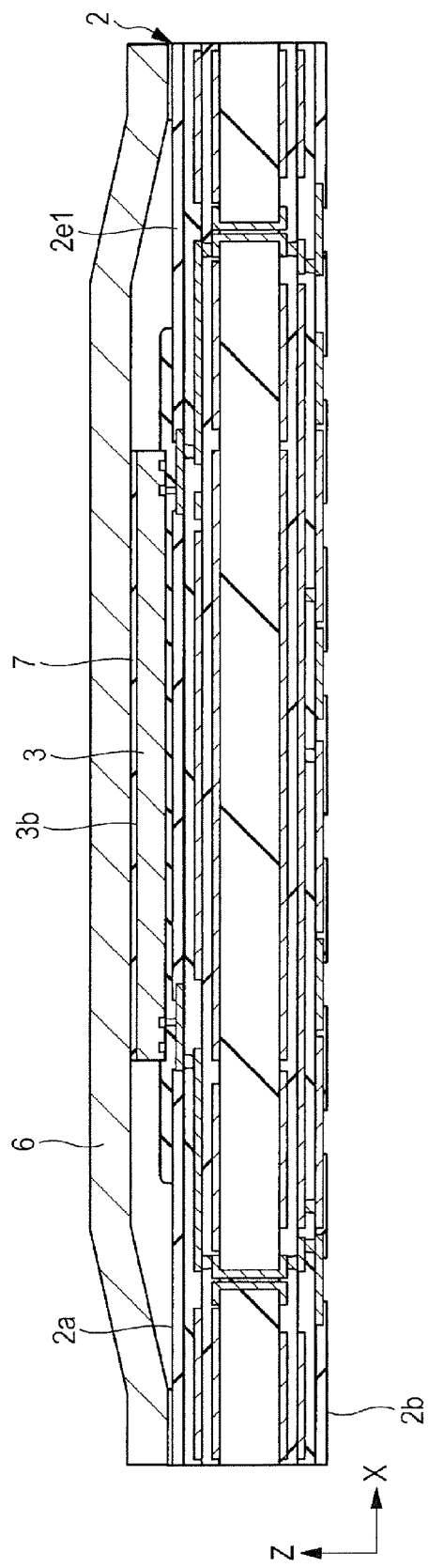
FIG. 18 is a cross-sectional view showing a heatsink mounted on the wiring substrate shown in FIG. 17

Next, in the heatsink mounting step shown in FIG. 7, as shown in FIG. 18, a heatsink 6 is attached to the back surface 3b of the semiconductor chip 3. FIG. 18 is a cross-sectional view showing a heatsink mounted on the wiring substrate shown in FIG. 17.

In the present step, for example, after application of an adhesive material (heat radiating resin) 7 to the back surface 3b of the semiconductor chip 3, the heatsink 6 is attached to the back surface. In the example shown in FIG. 18, the adhesive material is applied to the lower surface side of the heatsink, which is arranged to face to the wiring substrate 2, at the peripheral portion of the heatsink 6, and the peripheral portion of the heatsink 6 is attached and fixed to the wiring substrate 2 via the adhesive material.

<Ball Mounting Step>

Figure 19:
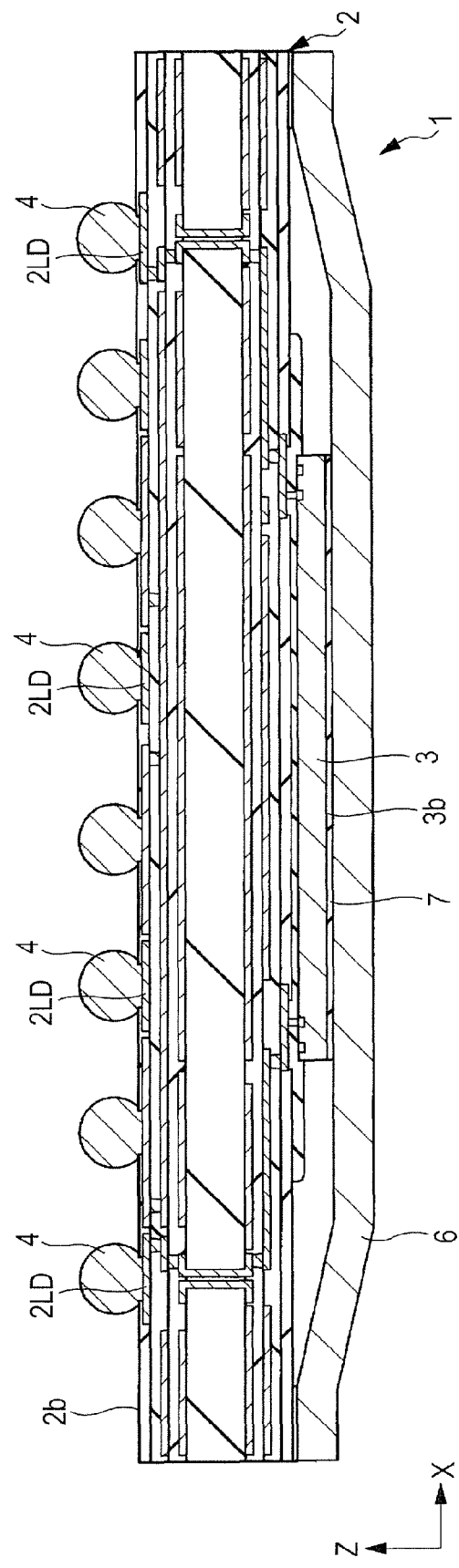
FIG. 19 is a cross-sectional view showing a plurality of solder balls connected with the mounting surface of the wiring substrate shown in FIG. 18.

Next, in the ball mounting step shown in FIG. 7, as shown in FIG. 19, a plurality of solder balls 4 is attached to the side of the lower surface 2b which is a mounting surface of the wiring substrate 2. FIG. 19 is a cross-sectional view showing a plurality of solder balls connected with the mounting surface of the wiring substrate shown in FIG. 18.

In the present step, the wiring substrate 2 is placed face down and the solder balls 4 are arranged on the exposed surface of the land 2LD formed on the lower surface 2b of the wiring substrate 2. The solder balls 4 are attached by subjecting the wiring substrate 2 to reflow treatment (treatment of heating to melt and bond a solder component and then cooling).

The semiconductor device 1 described referring to FIGS. 1 to 4 can be obtained using the above-mentioned steps. Then, after necessary inspections and tests including appearance inspection and electrical test, the semiconductor device is shipped or mounted on an unillustrated mounting substrate.

Inventions made by the present inventors have thus been described specifically based on the embodiment. The invention is not limited to or by the above embodiment but needless to say, it can be changed in various ways without departing from the scope of the invention. Various modification examples have been described above in the embodiment, but typical modification examples other than them will next be described.

Modification Example 1

Figure 20:
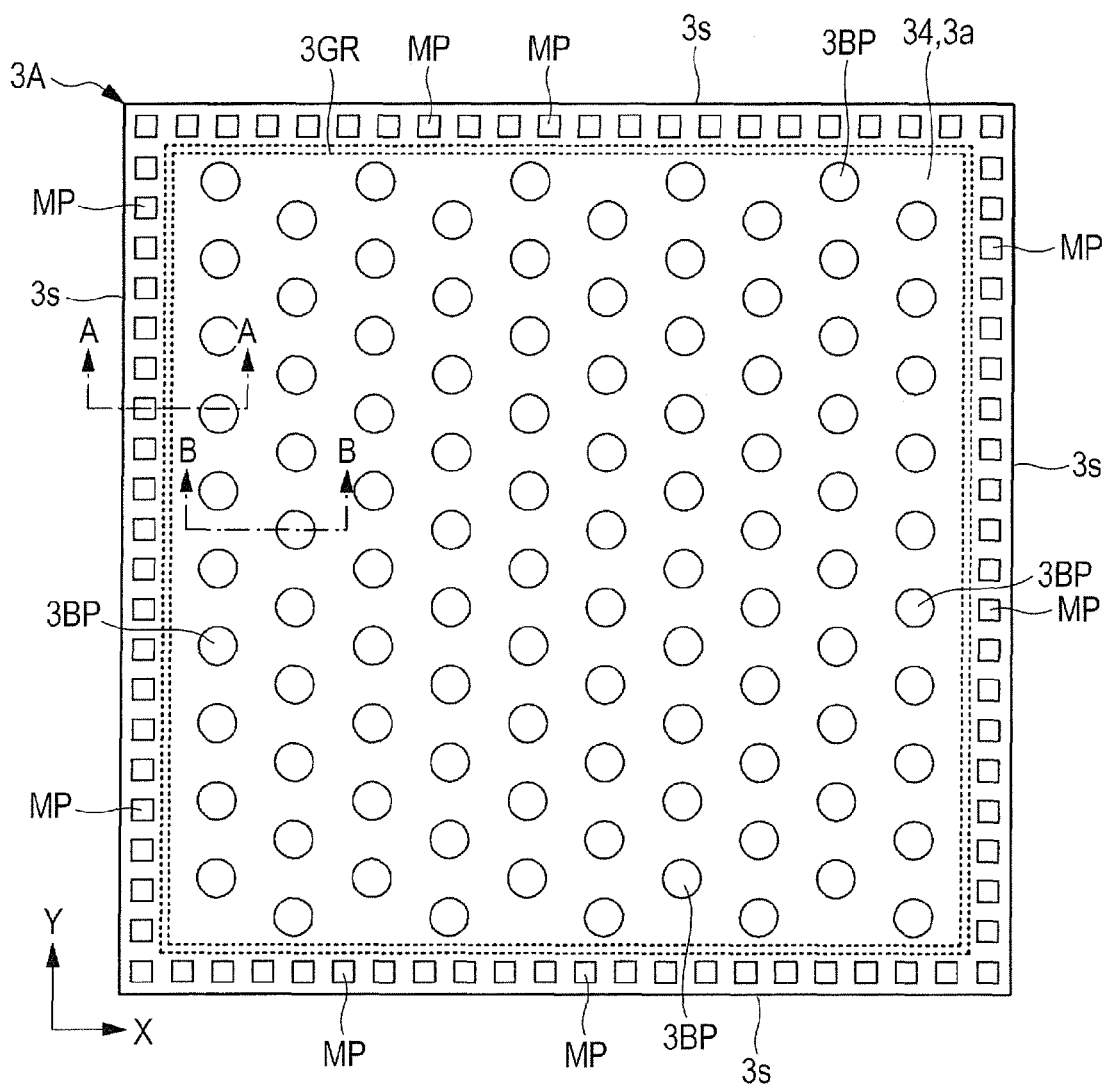
FIG. 20 is a plan view showing the surface side of a semiconductor chip which is a modification example of FIG. 5.
Figure 21:
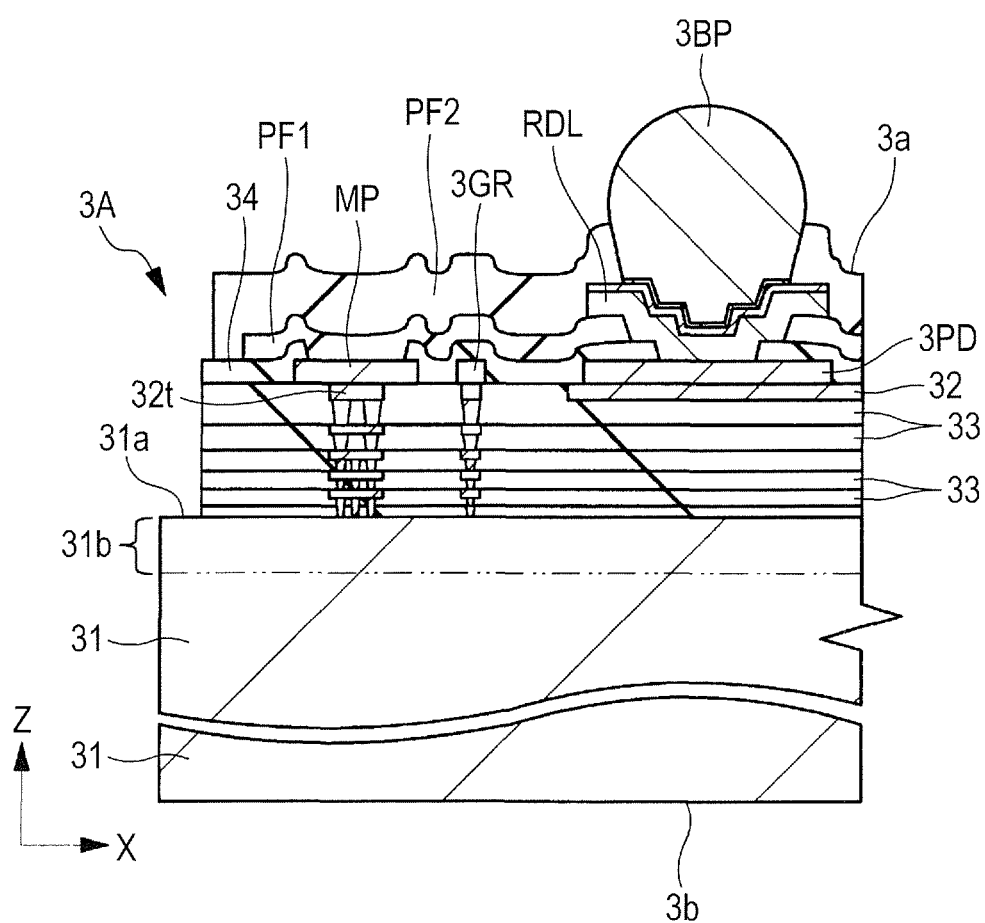
FIG. 21 is an enlarged cross-sectional view taken along the line A-A shown in FIG. 20.
Figure 22:
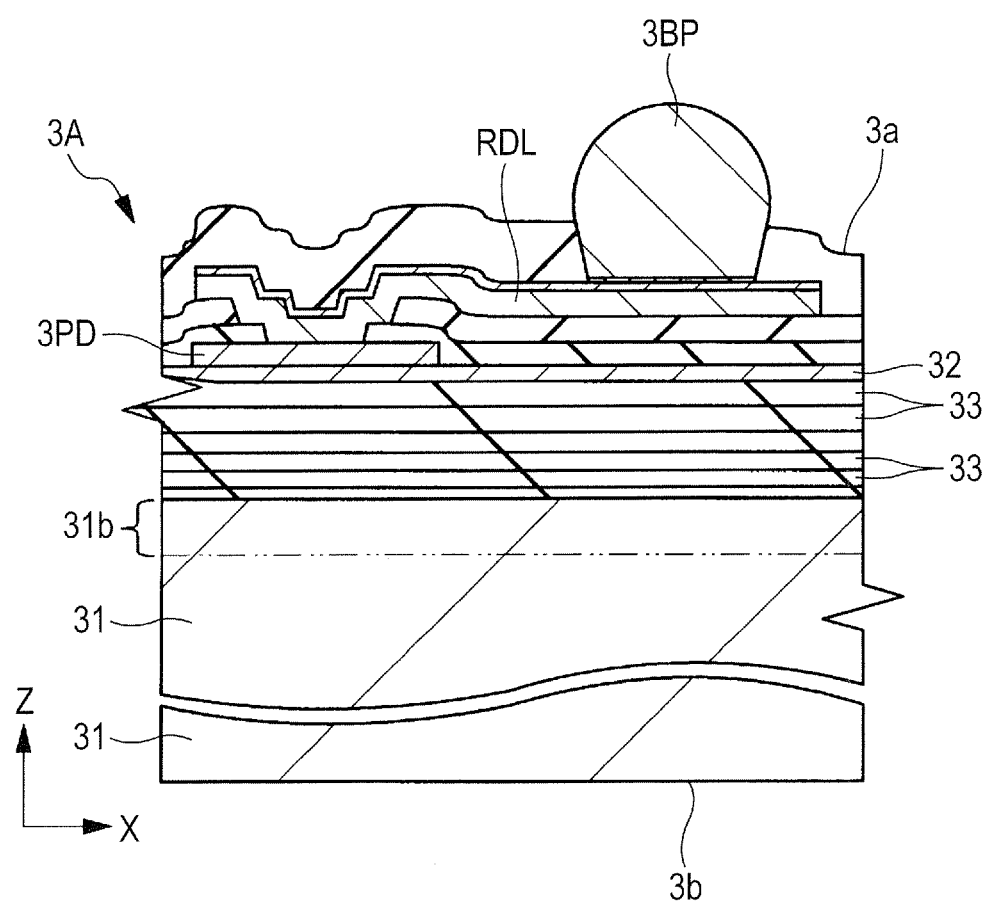
FIG. 22 is an enlarged cross-sectional view taken along the line B-B shown in FIG. 20.

For example, in the above embodiment, the semiconductor chip 3 having, in plan view, a plurality of electrodes arranged along each side of the peripheral portion of the surface 3a has been described as one example of a semiconductor chip. In a semiconductor chip 3A shown in FIGS. 20 to 22, on the other hand, a plurality of electrodes are formed in matrix form on the surface 3a. FIG. 20 is a plan view showing the surface side of the semiconductor chip which is a modification example of FIG. 5. FIGS. 21 and 22 are enlarged cross-sectional views taken along the line A-A and the line B-B in FIG. 20, respectively.

The semiconductor chip 3A has a plurality of protruding electrodes 3BP arranged in matrix form on the surface 3a and in this respect, it is different from the semiconductor chip 3 shown in FIG. 5. The protruding electrodes 3BP are made of, for example, a solder material and also in this respect, it is different from the semiconductor chip 3. The semiconductor chip 3A is also different from the semiconductor chip 3 shown in FIG. 6 in that in the former one, a redistribution layer RDL is connected onto the pad 3PD.

Since the semiconductor chip 3A has the redistribution layer RDL on the pad 3PD, the protruding electrode 3BP can be formed at a position different from that of the pad 3PD in plan view. As shown in FIG. 21, however, the protruding electrode 3BP is sometimes formed at a position overlapping with the pad 3PD in a thickness direction.

The redistribution layer RDL is, for example, a metal film stack obtained by stacking a copper film composed mainly of copper (Cu) and a nickel film composed mainly of nickel (Ni) in order of mention. At the connected portion of the protruding electrode 3BP, a gold film composed mainly of gold (Au) is formed from the standpoint of improving the connection characteristics with a solder.

The redistribution layer RDL is covered with an insulating film PF1 and an insulating film PF2 which are resin films such as polyimide. The insulating film PF1 is arranged as a lower layer of the redistribution layer RDL and the insulating film PF2 is arranged as an upper layer of the redistribution layer RDL. Thus, by sandwiching the redistribution layer RDL between the insulating film PF1 and the insulating film PF2, the redistribution layer RDL is protected. By inserting the insulating film PF1 between the redistribution layer RDL and the wiring 32, an electric influence on the wiring 32 can be reduced.

The redistribution layer RDL, insulating film PF1, insulating film PF2, and protruding electrode 3BP which are included in the semiconductor chip 3A are formed prior to the dicing step shown in FIG. 8. A semiconductor chip, like the semiconductor chip 3A, having the redistribution layer RDL connected onto the pad 3PD is called "WPP (Wafer Process Package)".

More specifically, after the testing step shown in FIG. 8, an insulating film PF1 is formed. Then, an opening portion is formed in the insulating film PF1 and from this opening portion, at least a portion of the pad 3PD is exposed. Next, a redistribution layer RDL is formed on the exposed surface of the pad 3PD and on the insulating film PF1. The redistribution layer RDL is formed by stacking a copper film and a nickel film successively, for example, by a plating method. Next, an insulating film PF2 is formed so as to cover therewith the redistribution layer RDL. Next, an opening portion is formed in the insulating film PF2 and from the opening portion, a portion of the redistribution layer RDL is exposed.

Next, a gold film is formed on a portion of the redistribution layer RDL exposed from the insulating film PF2. The gold film can be formed, for example, by an electroplating method. Solder balls are arranged, respectively, at a plurality of opening portions formed in the insulating film PF2, followed by reflow treatment to form protruding electrodes 3BP connected with a portion of the redistribution layer RDL.

When the technology described in the above embodiment is used for the WPP type semiconductor chip 3A, the metal pattern MP is covered preferably with at least one of the insulating film PF1 and the insulating film PF2 as shown in FIG. 21 after the testing step shown in FIG. 8. When the above-mentioned gold film is formed using an electroplating method, contact of a plating solution with the aluminum of the metal pattern MP sometimes makes the plating treatment unstable. The gold film can therefore be formed stably if plating treatment is performed while covering the metal pattern MP with at least one of the insulating film PF1 and the insulating film PF2.

After the semiconductor chip 3A is mounted on the wiring substrate 2 shown in FIG. 4, stress concentration is likely to occur at the peripheral portion of the surface 3a of the semiconductor chip 3A. On the other hand, the insulating film PF1 and the insulating film PF2 protecting the redistribution layer RDL therewith function as a stress relax layer for dispersing the stress concentrated on the peripheral portion of the surface 3a. Damage after mounting the semiconductor chip 3A on the wiring substrate 2 can be suppressed by widening at least one of the insulating film PF1 and the insulating film PF2 enough to cover the metal pattern MP arranged at the peripheral portion of the surface 3a with the film(s).

It is to be noted that the WPP type semiconductor chip 3A is sometimes not mounted on the wiring substrate 2 serving as an interposer as shown in FIG. 4 but may be directly mounted on an unillustrated mounting substrate. This means that the semiconductor chip 3A can be regarded as a semiconductor device. In this case, each step other than the semiconductor chip provision step shown in FIG. 7 can be omitted.

The present modification example 1 is similar to the technology described in the above embodiment except for the differences described above. Therefore, an overlapping description is omitted.

Modification Example 2

In the above embodiment, the mode in which metal patterns MP are arranged in three columns along the extending direction of the dicing region CDp in the dicing region DCp of the wafer WH as shown in FIG. 11 has been described exemplarily. There is a modification example of the above embodiment in which the number of the columns of the metal patterns MP is other than three.

Figure 23:
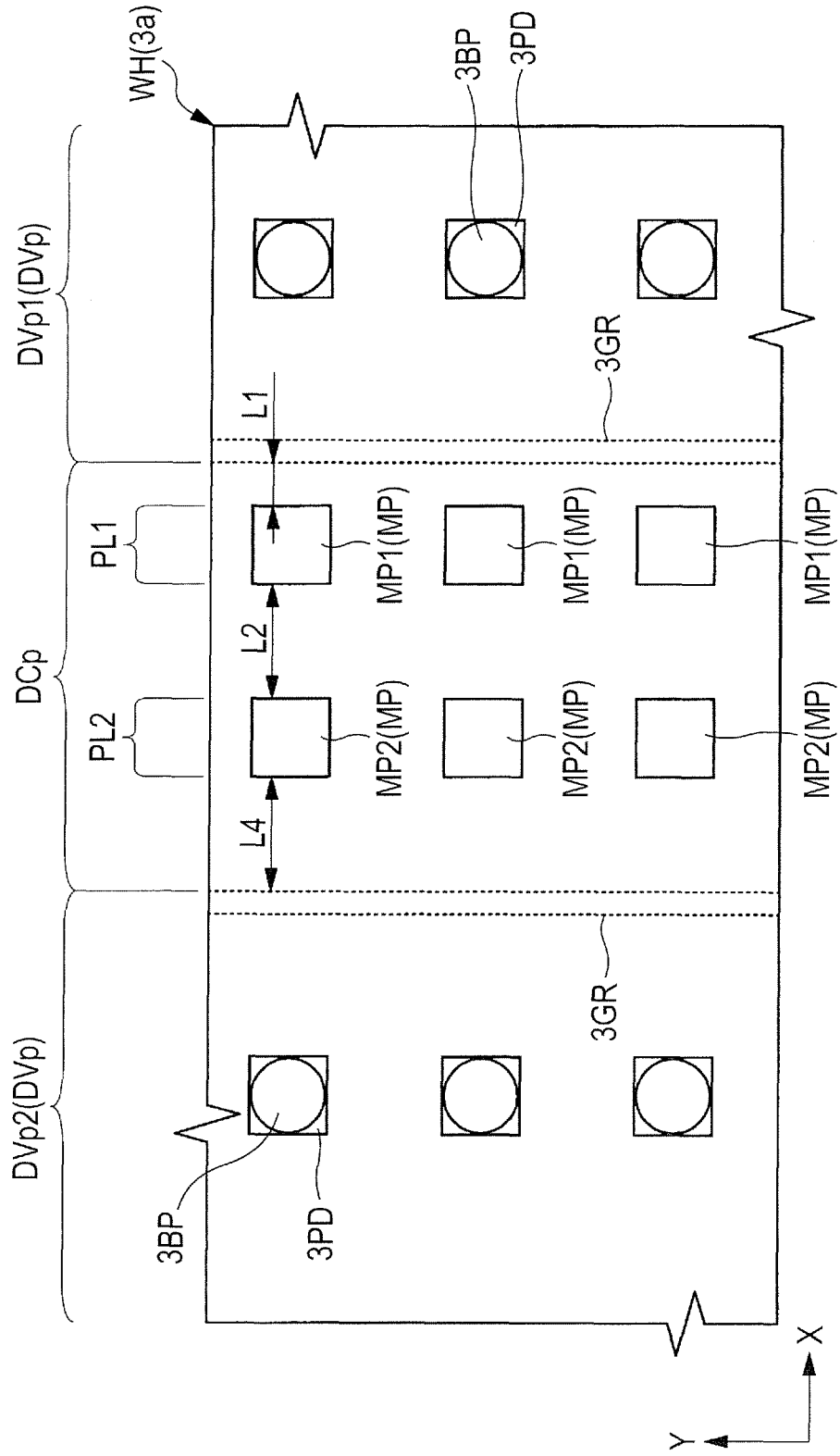
FIG. 23 is an enlarged plan view showing a modification example of FIG. 11.
Figure 24:
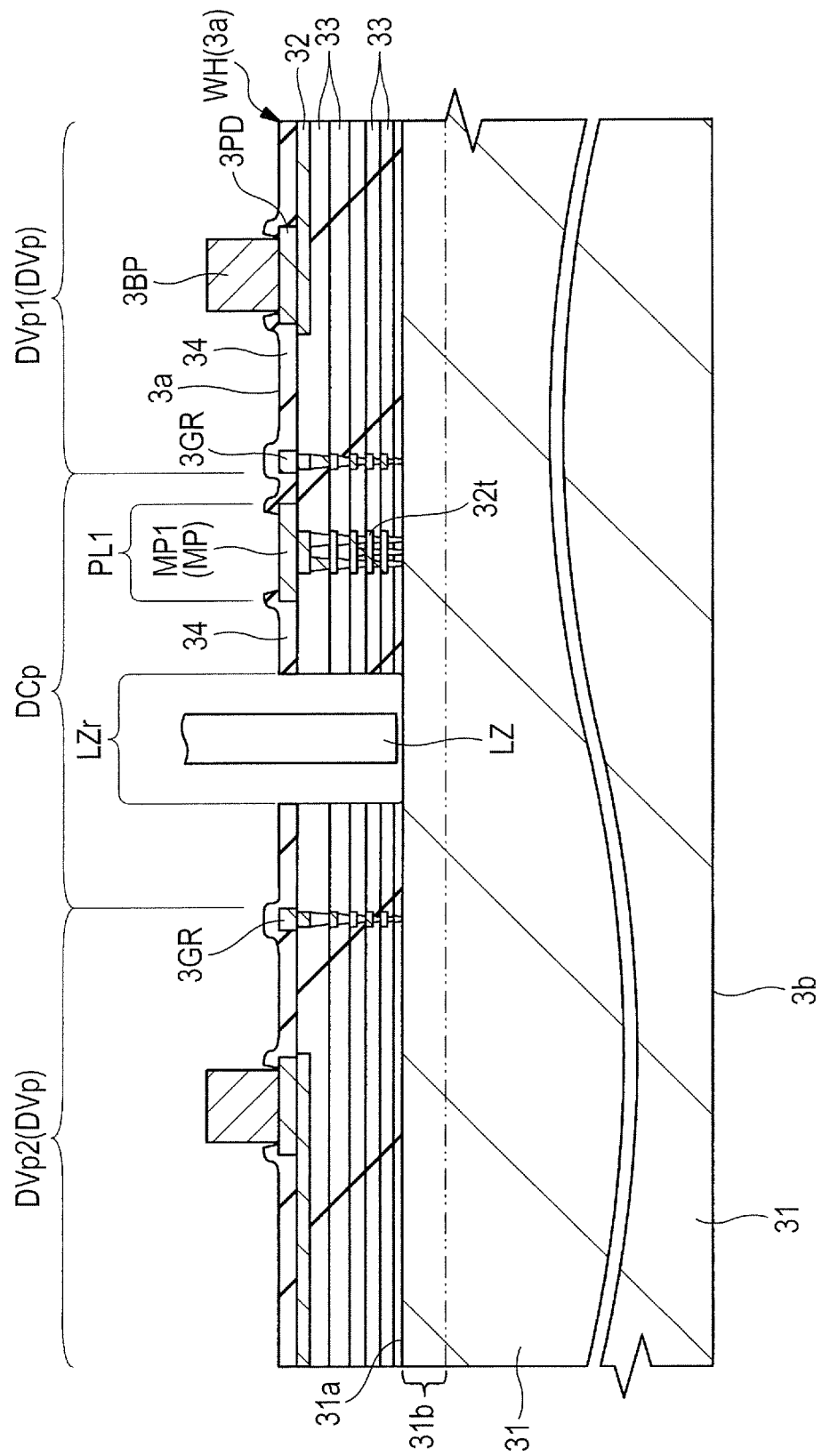
FIG. 24 is an enlarged cross-sectional view showing the cross-section along the direction X of FIG. 23 after removal of one of the columns of metal patterns.

For example, the modification example shown in FIG. 23 is different from the embodiment shown in FIG. 11 in that the dicing region DCp has therein two columns of metal patterns MP along the extending direction of the dicing region DCp. FIG. 23 is an enlarged plan view showing a modification example of FIG. 11. FIG. 24 is an enlarged cross-sectional view showing the cross-section along the direction X of FIG. 23 after removal of one of the columns of metal patterns.

In the mode shown in FIG. 23, a plurality of metal patterns MP has metal patterns MP1 arranged in Column PL1 closest to the chip region DVp1 and metal patterns MP2 arranged in Column PL2 further from the chip region DVp1 than the metal patterns MP1. When the metal patterns MP are arranged in two columns, either one of Column PL1 and Column PL2 is removed. In the example shown in FIG. 24, the metal patterns MP2 of Column PL2 shown in FIG. 23 are removed. As shown in FIG. 24, the metal patterns MP1 of Column PL1 not removed in the dicing step are not irradiated with the laser light LZ. The wirings 32t connected with the metal patterns MP1 are not irradiated with the laser light LZ. The metal patterns mP1 and the wirings 32t connected with the metal patterns MP1 remain adjacent to the chip region DVp1 without being damaged after the laser irradiation step.

In view of the processing margin at the time of removing the metal patterns MP2 of Column PL2 shown in FIG. 23, the distance between the metal patterns MP2 and other metal patterns (metal patterns MP1 and the seal ring 3GR of the chip region DVp2) is preferably made greater. As shown in FIG. 23, the metal patterns MP1 to be not removed in the laser irradiation step are preferably formed in the vicinity of the side of the chip region DVp1. More specifically, in the present modification example, the distance (Distance L1) between the chip region DVp1 and the metal patterns MP1 is smaller than the distance (Distance L2) between the metal patterns MP1 and the metal patterns MP2, as shown in FIG. 23. The distance (Distance L1) between the chip region DVp1 and the metal patterns MP1 is smaller than the distance (Distance L4) between the chip region DVp2 and the metal patterns MP2.

As descried above, a processing margin at the time of removing the metal patterns MP2 can be widened by making Distance L1 between the metal patterns MP1 not removed in the laser irradiation step and the chip region DVp1 smaller than Distance L4 between the chip region DVp2 and the metal patterns Mp2. This makes it possible to selectively remove the metal patterns MP2 while suppressing damage of the metal patterns MP1.

Figure 25:
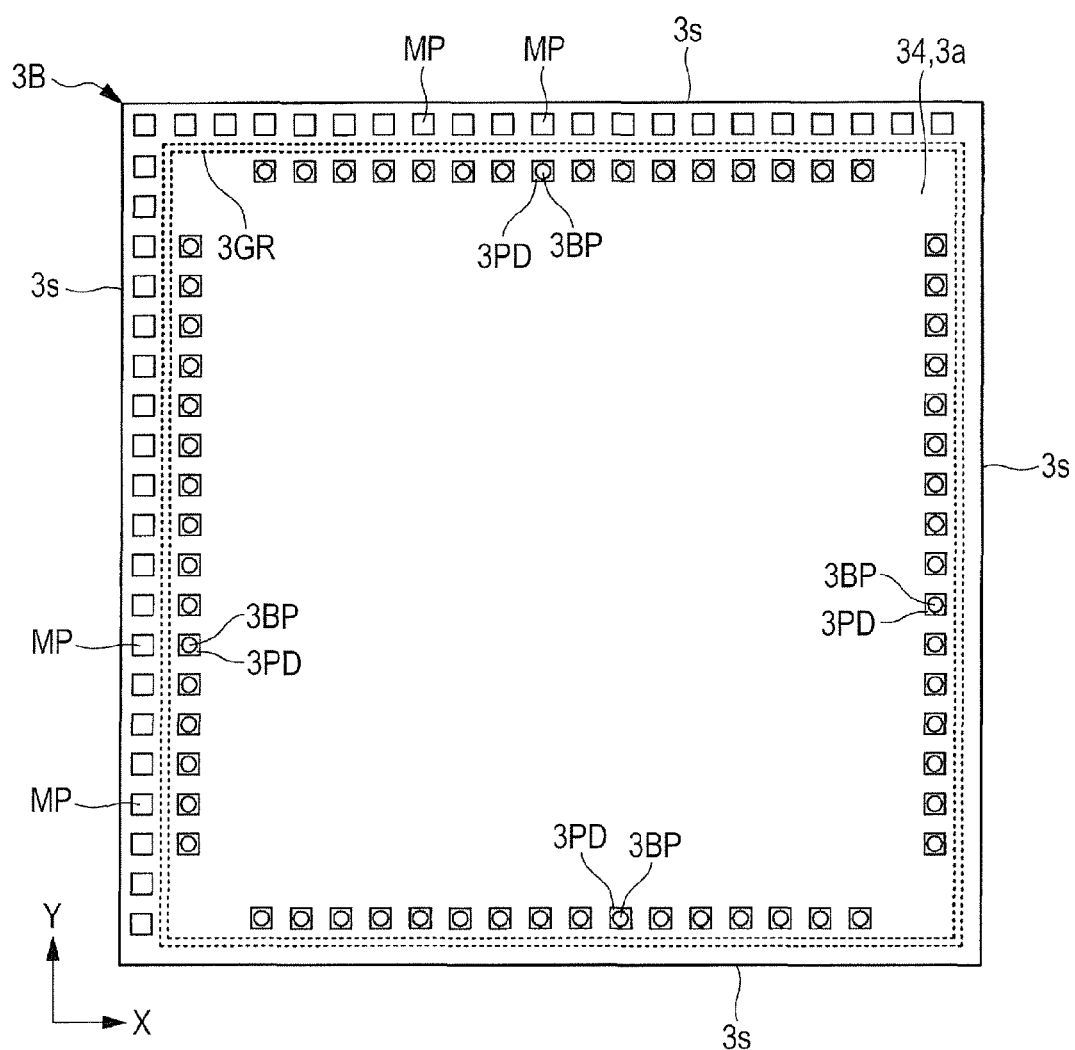
FIG. 25 is a plan view of the surface side of a semiconductor chip obtained from the modification example shown in FIGS. 23 and 24.

When as in the present modification example, the metal patterns MP2 belonging to one of two columns of the metal patterns MP formed in the dicing region DCp are removed and the metal patterns MP1 belonging to the other column are left, a semiconductor chip 3B shown in FIG. 25 can be obtained. The semiconductor chip 3B is different from the semiconductor chip 3 shown in FIG. 5 in that a plurality of metal patterns MP is arranged selectively along some sides of four sides forming a profile of the surface 3a having a quadrangular planar shape. In other words, the semiconductor chip 3B is different from the semiconductor chip 3 shown in FIG. 5 in that the surface 3a of the semiconductor chip 3B has a side along which no metal patterns have been arranged. According to the present modification example, after removal of the metal patterns MP2, a portion integrated with the chip region DVp2 (refer to FIG. 24) and remaining outside the seal ring 3GR has an increased volume. The semiconductor chip 3B is therefore hard to cause chipping or cracks.

However, a portion remaining outside the seal ring 3GR in the semiconductor chip 5 shown in FIG. 5 has a greater volume than that in the semiconductor chip 3B shown in FIG. 25. The number of columns of the metal patterns MP arranged along the extending direction of the dicing region DCp is particularly preferably three or more.

Although not illustrated, as a modification example of FIG. 11, the metal patterns MP may be arranged in four or more columns in the dicing region DCp along the extending direction of the dicing region DCp. In this case, in the dicing step, at least the metal patterns MP of the columns on both ends, among the metal patterns arranged in four or more columns, are preferably left without removal. When the number of the columns of the metal patterns MP is set at four or more, the width of the dicing region DCp in the direction X is not limited to from about 250 to 350 μm and it may be wider.

The plurality of metal patterns arranged in the columns other than those on both sides can be removed completely in the dicing step. An increase in the number of columns to be removed in the dicing step prolongs the treatment time when the laser irradiation treatment method is employed. When the machining treatment is employed, on the other hand, the dicing blade needs a greater width so that an increase in the number of columns to be removed in the dicing step has a large influence, for example, an influence of vibration on the periphery of a portion to be machined. Even when the metal patterns MP are arranged in a plurality of columns in addition to the columns on both ends, selective removal of one of the plurality of columns is particularly preferred.

Modification Example 3

In the above embodiment, the method of using the laser irradiation treatment method and the machining treatment method in combination in the dicing step shown in FIG. 8 has been described. In the dicing step shown in FIG. 8, however, the wafer WH may be cut using the laser irradiation treatment method. Alternatively, in the dicing step shown in FIG. 8, the metal patterns MP2 and the wirings 32t connected with the metal patterns MP2, each shown in FIG. 12, may be removed with a dicing blade without irradiating the wafer with a laser. In this case, the metal patterns MP2 are machined without bringing the dicing blade into contact with the metal patterns MP1 and the metal patterns MP3.

Modification Example 4

Figure 26:
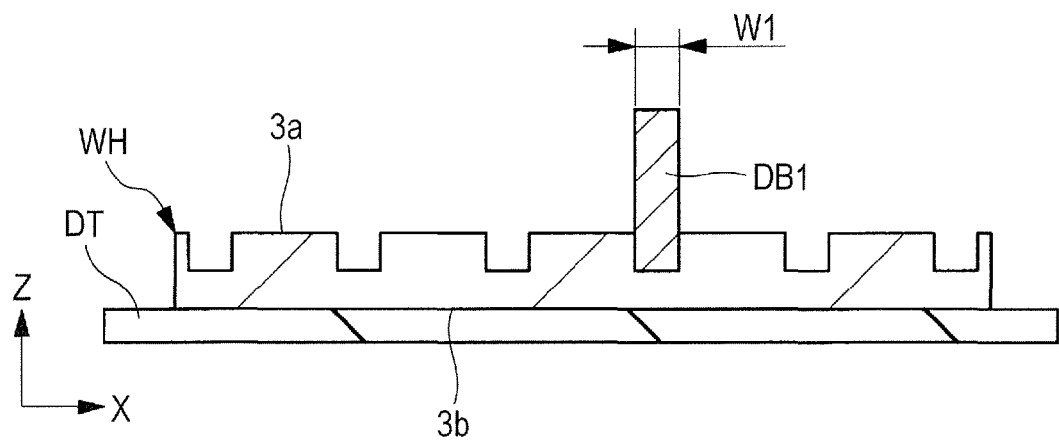
FIG. 26 is an explanatory view schematically showing a modification example of the dicing step described referring to FIG. 14.
Figure 27:
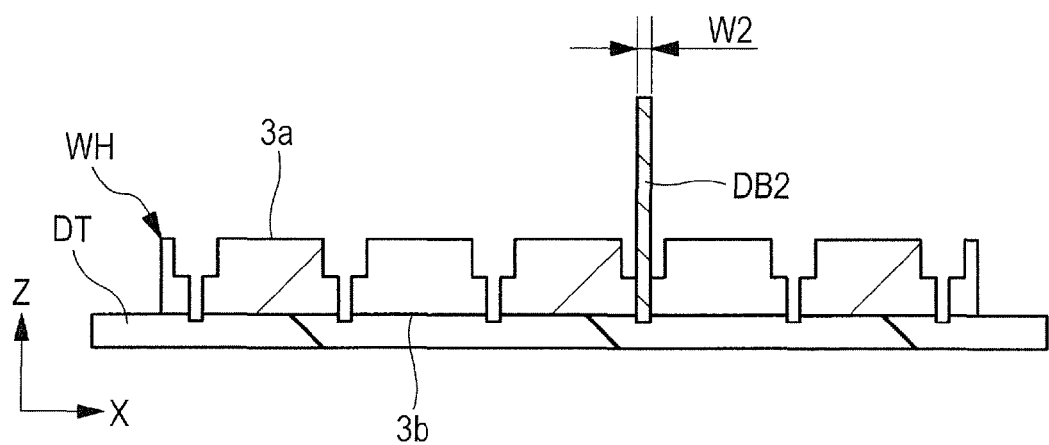
FIG. 27 is an explanatory view schematically showing a modification example of the dicing step described referring to FIG. 14.

In the above embodiment, the mode in which the semiconductor substrate 31 is cut from the main surface side to the back surface 3b with a single kind of a dicing blade, that is, the dicing blade DB in the dicing step shown in FIG. 8 has been described. As a modification example of the embodiment, however, the wafer WH may be cut with a plurality of kinds of dicing blades different in width as shown in FIGS. 26 and 27. FIGS. 26 and 27 are explanatory views schematically showing a modification example of the dicing step described referring to FIG. 14.

In the modification example shown in FIGS. 26 and 27, machining of the wafer WH from the side of the surface 3a is performed using a dicing blade DB1 having a first width W1. At this time, the dicing blade DB1 does not reach the back surface 3b of the wafer WH and machining with it extends to a position between the surface 3a and the back surface 3b in the thickness direction of the wafer WH. Next, as shown in FIG. 27, the wafer WH is machined from the side of the surface 3a with a dicing blade DB2 having a second width W2. At this time, the dicing blade DB2 is inserted in a groove formed with the dicing blade DB1 shown in FIG. 26 and machines the wafer until it reaches the back surface 3b of the wafer WH. Thus, the wafer WH is cut with the dicing blade DB2.

A method of cutting the wafer WH in stages with a plurality of kinds of dicing blades different in width as described above is called "step dicing method". As described above, in the case of the machining treatment method with a dicing blade, an influence such as vibration on the periphery of a portion to be processed can be reduced when the width of the tip surface of the dicing blade is smaller. When the width of the dicing blade at the tip surface thereof becomes smaller, however, the resulting dicing blade has deteriorated durability and the dicing blade itself becomes vulnerable to damage. In the modification example shown in FIGS. 26 and 27, therefore, the wafer WH is cut using the step dicing method. This makes it possible to suppress the damage of the dicing blade DB2 and at the same time, reduce the influence such as vibration on the periphery of a portion to be processed during machining.

Modification Example 5

One example of the manufacturing steps of a semiconductor chip has been described, but various modification examples can be used. For example, in the above embodiment, the mode of performing the dicing step after the testing step has been described. As a modification example of the above embodiment, a step of grinding the back surface 3b of the wafer WH to decrease the thickness of the wafer WH may be added between the testing step and the dicing step. An amount of a member to be removed in the dicing step can be reduced when the dicing step is performed after thinning the wafer WH. This makes it possible to lessen the influence such as vibration on the periphery of a portion to be processed, for example, at the time of machining the wafer WH with a dicing blade.

Modification Example 6

One example of the mode of the semiconductor chip 3 has been described in FIGS. 1 to 4, but the mode of the semiconductor chip 3 has various modification examples. For example, although not illustrated, the semiconductor 3 can be mounted on the wiring substrate 2 by using a so-called face-up mounting method in which the upper surface 2a, a chip mounting surface, of the wiring substrate 2, faces to the back surface 3b of the semiconductor chip 3 instead of mounting the semiconductor chip 3 on the wiring substrate 2 by using the face-down mounting method described in the above embodiment. In addition, in the above embodiment, the mode of attaching a heatsink has been described, but a modification example in which no heatsink is attached may be employed. In this case, the heatsink mounting step shown in FIG. 7 can be omitted.

Modification Example 7

Modification examples can be used in combination without departing from the scope of the technical concept described in the above embodiment.

What is claimed is:
1. A method of manufacturing a semiconductor device, comprising the steps of:
   (a) providing a semiconductor wafer having a first chip region, a second chip region arranged adjacent to the first chip region in plan view, a dicing region arranged between the first chip region and the second chip region in plan view, and a plurality of metal patterns arranged in a plurality of columns in the dicing region and arranged along an extending direction of the dicing region; and
   (b) cutting, in the dicing region of the semiconductor wafer, the semiconductor wafer along the extending direction of the dicing region,
   wherein the metal patterns have a first-column pattern arranged in a column closest to the first chip region and second column patterns arranged in a column further from the first chip region than the first column pattern,
   wherein a distance between the first chip region and the first column pattern is smaller than a distance between the first column pattern and the second column pattern and is smaller than a distance between the second chip region and the second column pattern, and wherein in the step (b), the first column pattern is not removed, but the second column pattern is removed.

2. The method of manufacturing a semiconductor device according to claim 1,
wherein the step (b) comprises a step of transferring a dicing blade along the extending direction of the dicing region without bringing the dicing blade into contact with the first column pattern and thereby machining and cutting the semiconductor wafer.

3. The method of manufacturing a semiconductor device according to claim 2,
wherein the step (b) comprises a step of irradiating the dicing region with a laser light to remove the second column pattern before machining the semiconductor wafer with the dicing blade, and
wherein the second column pattern is irradiated with the laser light while preventing the first column pattern from being irradiated therewith.

4. The method of manufacturing a semiconductor device according to claim 3,
wherein the semiconductor wafer has a semiconductor substrate and a plurality of wiring layers stacked one after another over a main surface of the semiconductor substrate, and
wherein in the step (b), the second column pattern is removed by irradiation with the laser light to expose the main surface of the semiconductor substrate.

5. The method of manufacturing a semiconductor device according to claim 3,
wherein in the step (b), the dicing blade is inserted into a groove formed by irradiation with the laser light.

6. The method of manufacturing a semiconductor device according to claim 1,
wherein the first chip region and the second chip region each have, at the respective peripheral portions thereof, a plurality of electrode pads and a metal member continuously surrounding therewith a region in which the electrode pads are arranged.

7. The method of manufacturing a semiconductor device according to claim 1,
wherein the metal patterns further have a third column pattern arranged between the second column pattern and the second chip region,
wherein a distance between the second chip region and the third column pattern is smaller than a distance between the third column pattern and the second column pattern and is smaller than a distance between the first chip region and the second column pattern, and
wherein in the step (b), the third column pattern remains without being removed.

8. The method of manufacturing a semiconductor device according to claim 1,
wherein the first column pattern, among the metal patterns, is covered with an insulating film having a resin.

9. The method of manufacturing a semiconductor device according to claim 1,
wherein the first chip region and the second chip region each have an electrode pad, a redistribution layer connected with the electrode pad, an insulating film covering the redistribution layer therewith, and a protruding electrode to be connected with a portion of the redistribution layer at an opening portion formed in the insulating film,
wherein the protruding electrode and a portion of the redistribution layer are connected with each other via a gold film formed by a electroplating method, and
wherein the metal patterns are each covered with the insulating film.

10. The method of manufacturing a semiconductor device according to claim 1,
wherein the step (a) comprises a step of bringing a contact terminal into contact with the metal patterns and thereby making a test.

11. The method of manufacturing a semiconductor device according to claim 1, further comprising the step of:
(c) providing a wiring substrate having a chip mounting surface and mounting the semiconductor chip obtained in the step (b) over the chip mounting surface of the wiring substrate.

12. The method of manufacturing a semiconductor device according to claim 11,
wherein the semiconductor chip has a surface, a plurality of protruding electrodes formed over the surface, and a back surface positioned on a side opposite to the surface, and
wherein in the step (c), the semiconductor chip and the wiring substrate are electrically connected with each other via the protruding electrodes while facing the surface of the semiconductor chip to the chip mounting surface of the wiring substrate.

13. The method of manufacturing a semiconductor device according to claim 1,
wherein the step (b) comprises a step of irradiating the dicing region with a laser light to remove the second column pattern, and
wherein the second column pattern is irradiated with the laser light without irradiating the first column pattern therewith.

14. A method of manufacturing a semiconductor device, comprising the steps of:
(a) providing a semiconductor wafer having a first chip region, a second chip region arranged adjacent to the first chip region in plan view, a dicing region arranged between the first chip region and the second chip region in plan view, and a plurality of metal patterns arranged in a plurality of columns in the dicing region and arranged along an extending direction of the dicing region; and
(b) cutting, in the dicing region of the semiconductor wafer, the semiconductor wafer along the extending direction of the dicing region,
wherein the metal patterns have a first-column pattern arranged in a column closest to the first chip region, second column patterns arranged in a column closest to the second chip region, and third column patterns arranged between the first column pattern and the second column pattern,
wherein a distance between the first chip region and the first column pattern is smaller than a distance between the first column pattern and the third column pattern and is smaller than a distance between the second column pattern and the third column pattern,
wherein a distance between the second chip region and the second column pattern is smaller than a distance between the second column pattern and the third column pattern and is smaller than a distance between the first column pattern and the third column pattern, and
wherein in the step (b), neither the first column pattern nor the second column pattern is removed and the third column pattern is removed.

* * * * *

UNITED STATES PATENT AND TRADEMARK OFFICE
CERTIFICATE OF CORRECTION

PATENT NO. : 9,023,717 B2  
APPLICATION NO. : 14/485649  
DATED : May 5, 2015  
INVENTOR(S) : Kazuyuki Nakagawa et al.

Page 1 of 1

It is certified that error appears in the above-identified patent and that said Letters Patent is hereby corrected as shown below:

Title Page, below Item (22) insert:

--(30)     Foreign Application Priority Data

Sep. 13, 2013     (JP).................................................2013-190738--

Signed and Sealed this
Twelfth Day of April, 2016

Michelle K. Lee
*Director of the United States Patent and Trademark Office*